(12) United States Patent
Namkoong et al.

(10) Patent No.: US 9,905,664 B2
(45) Date of Patent: *Feb. 27, 2018

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Hyun Namkoong, Seoul (KR); Dong-Kyum Kim, Suwon-si (KR); Jung-Hwan Kim, Seoul (KR); Jung Geun Jee, Seoul (KR); Han-Vit Yang, Suwon-si (KR); Ji-Man Yoo, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/604,646

(22) Filed: May 24, 2017

(65) Prior Publication Data

US 2017/0278936 A1 Sep. 28, 2017

Related U.S. Application Data

(62) Division of application No. 15/015,116, filed on Feb. 3, 2016, now Pat. No. 9,698,231.

(30) Foreign Application Priority Data

Mar. 31, 2015 (KR) .................. 10-2015-0045245

(51) Int. Cl.
*H01L 29/792* (2006.01)
*H01L 21/336* (2006.01)
(Continued)

(52) U.S. Cl.
CPC .. *H01L 29/42328* (2013.01); *H01L 21/28273* (2013.01); *H01L 21/28282* (2013.01);
(Continued)

(58) Field of Classification Search
CPC ................................. H01L 29/42328
(Continued)

(56) References Cited

U.S. PATENT DOCUMENTS 5,091,763 A 2/1992 Sanchez
6,333,251 B1 12/2001 Lee et al.
(Continued)

FOREIGN PATENT DOCUMENTS

KR 20010008614 A 2/2001
KR 20010060552 A 7/2001
(Continued)

*Primary Examiner* — Calvin Lee
(74) *Attorney, Agent, or Firm* — Renaissance IP Law Group LLP

(57) ABSTRACT

A semiconductor device includes a substrate, a tunnel insulation pattern on the substrate, a charge storage pattern on the tunnel insulation pattern, a dielectric pattern having a width smaller than a width of the charge storage pattern on the charge storage pattern, a control gate having a width greater than the width of the dielectric pattern on the dielectric pattern, and a metal-containing gate on the control gate.

12 Claims, 34 Drawing Sheets

(51) Int. Cl.
*H01L 29/423* (2006.01)
*H01L 21/28* (2006.01)
*H01L 29/66* (2006.01)
*H01L 29/788* (2006.01)
*H01L 27/11519* (2017.01)
*H01L 27/11521* (2017.01)
*H01L 27/11565* (2017.01)
*H01L 27/11582* (2017.01)

(52) U.S. Cl.
CPC .. *H01L 27/11519* (2013.01); *H01L 27/11521* (2013.01); *H01L 27/11565* (2013.01); *H01L 27/11582* (2013.01); *H01L 29/42324* (2013.01); *H01L 29/42344* (2013.01); *H01L 29/66825* (2013.01); *H01L 29/7881* (2013.01); *H01L 29/7926* (2013.01)

(58) Field of Classification Search
USPC .......... 438/257–266; 257/326, 316, 318–320
See application file for complete search history.

(56) References Cited

U.S. PATENT DOCUMENTS

| | | | |
|---|---|---|---|
| 6,559,008 B2 | 5/2003 | Rabkin et al. | |
| 7,569,465 B2 | 8/2009 | Chen et al. | |
| 7,598,564 B2 * | 10/2009 | Kang | H01L 27/115 257/315 |
| 7,714,378 B2 | 5/2010 | Kim et al. | |
| 8,148,216 B2 | 4/2012 | Arai et al. | |
| 8,222,684 B2 | 7/2012 | Lee et al. | |
| 9,698,231 B2 * | 7/2017 | Namkoong | H01L 29/42344 257/326 |

FOREIGN PATENT DOCUMENTS

| | | |
|---|---|---|
| KR | 20050059902 A | 6/2005 |
| KR | 100685632 B1 | 2/2007 |
| KR | 100713914 B1 | 5/2007 |
| KR | 100818074 B1 | 3/2008 |
| KR | 20110003041 A | 1/2011 |

* cited by examiner

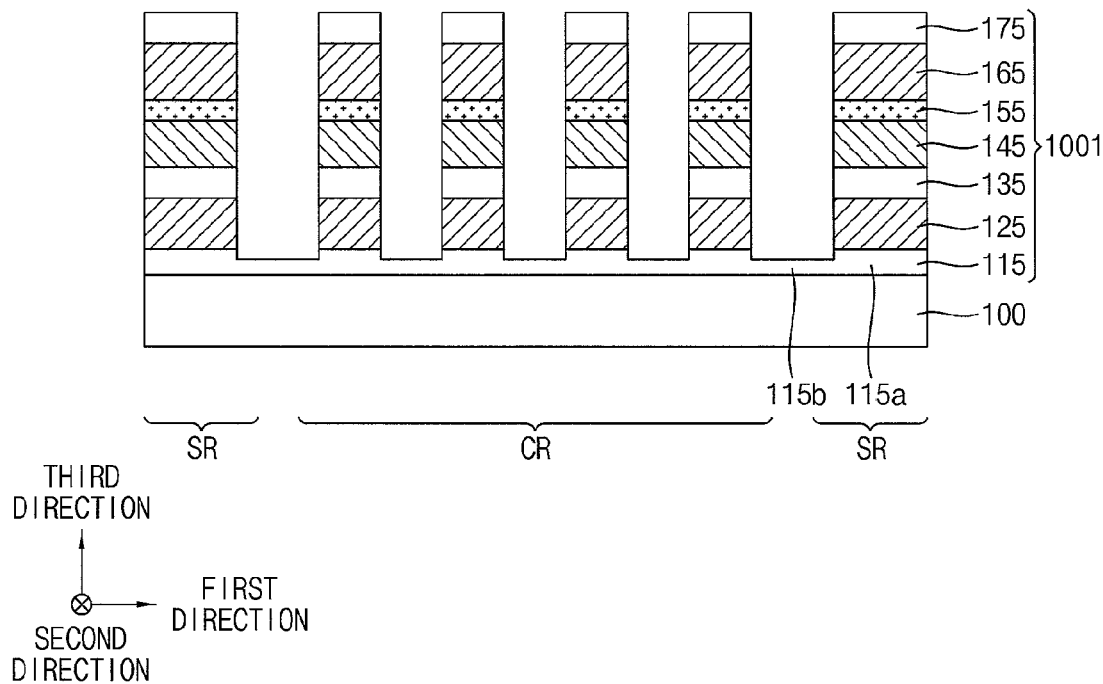
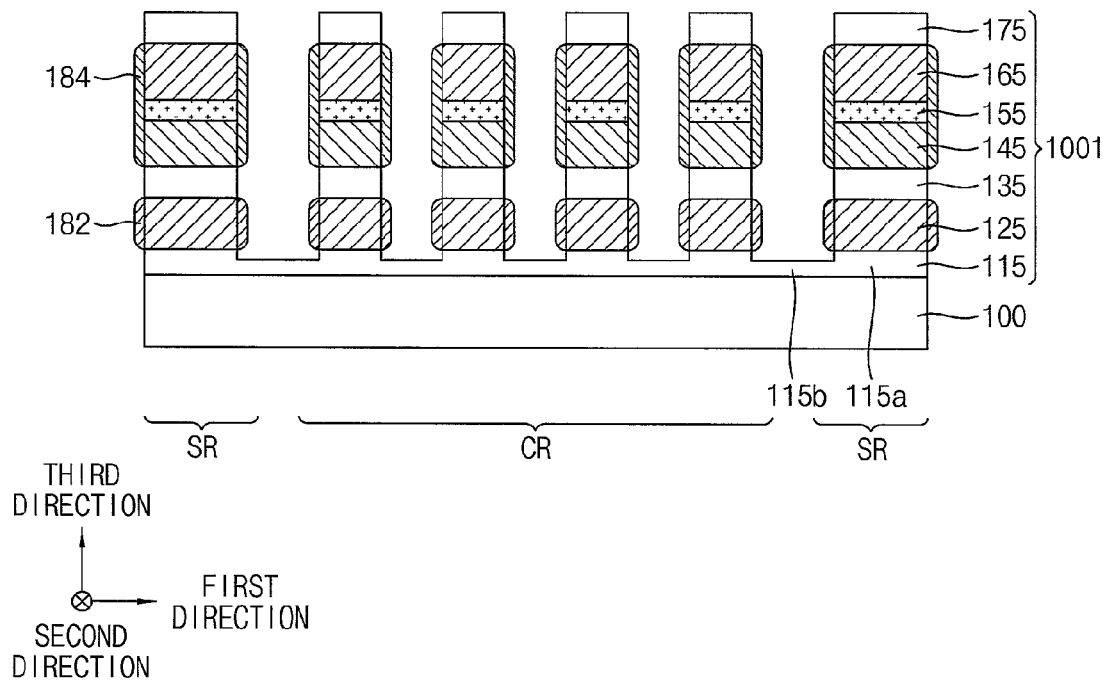

FIG. 5
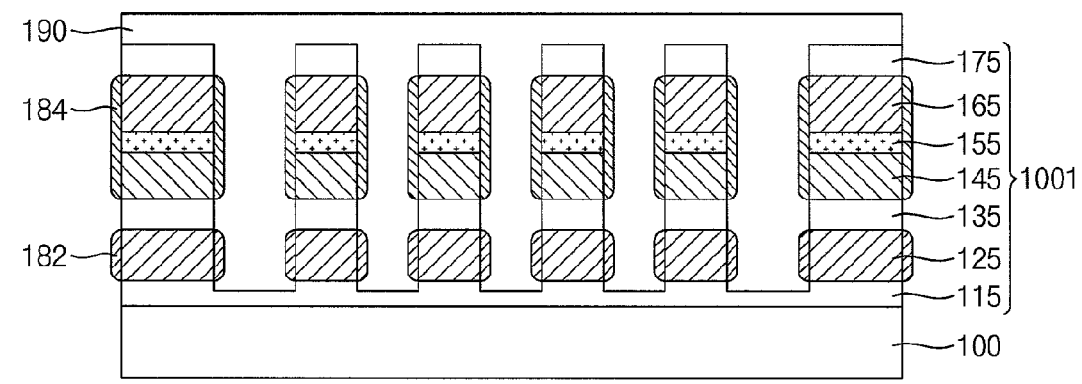
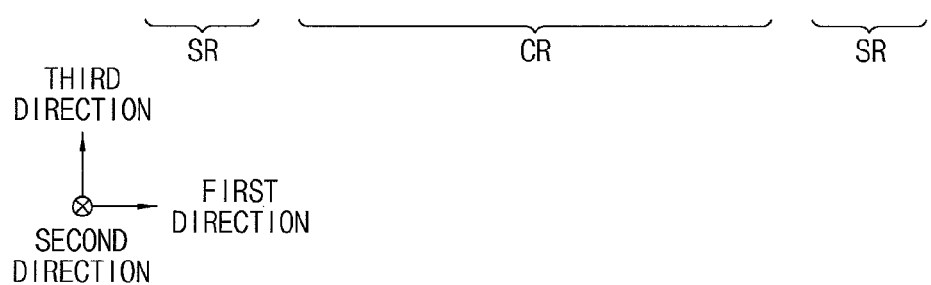
FIG. 6
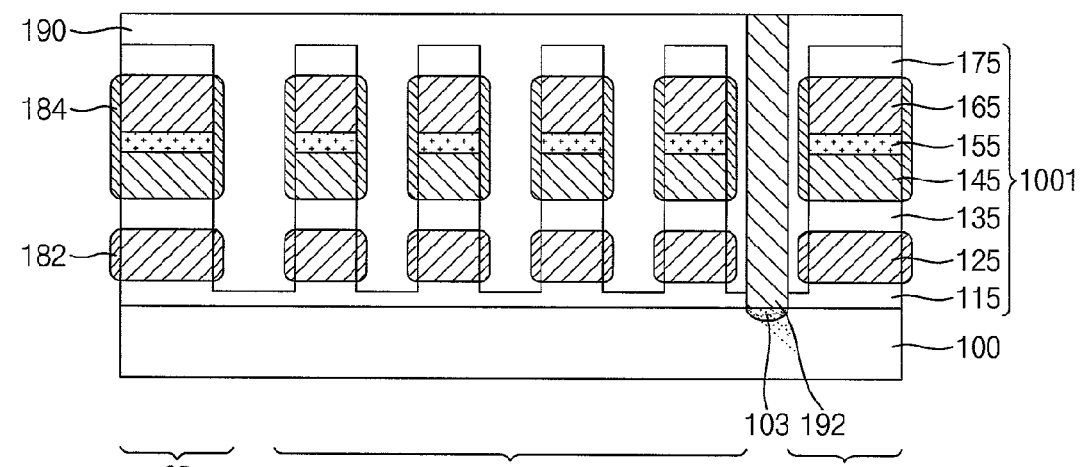
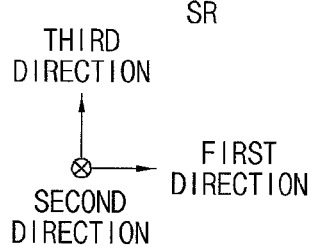

FIG. 18
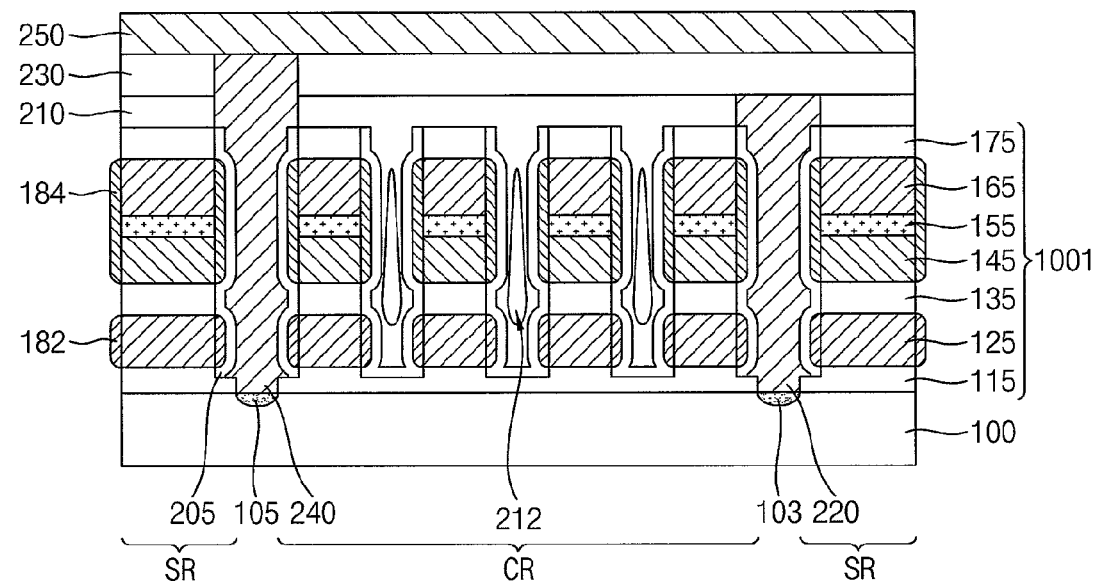
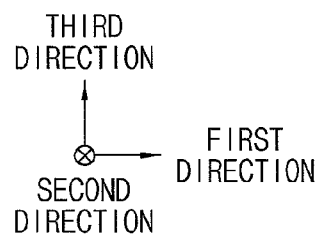

FIG. 20
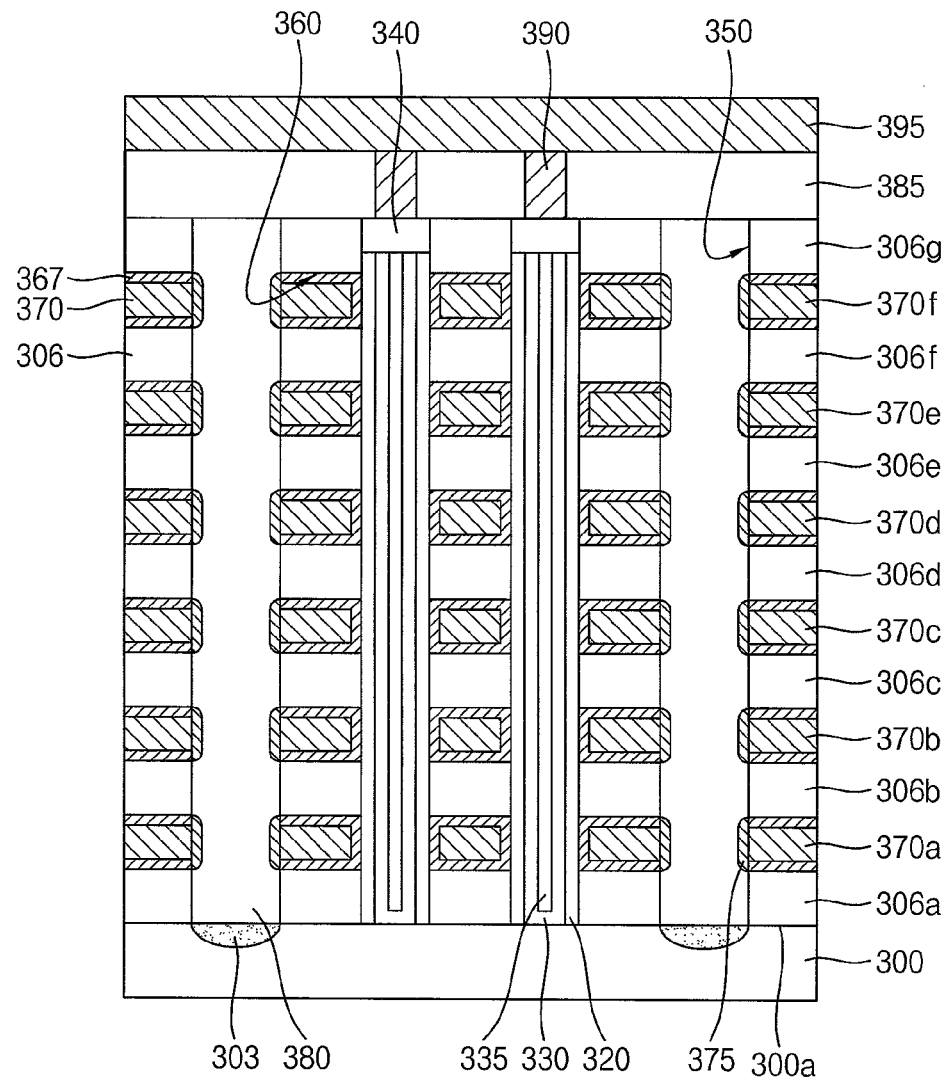
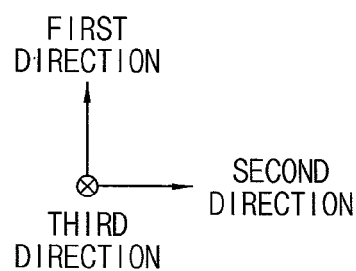

FIG. 23A
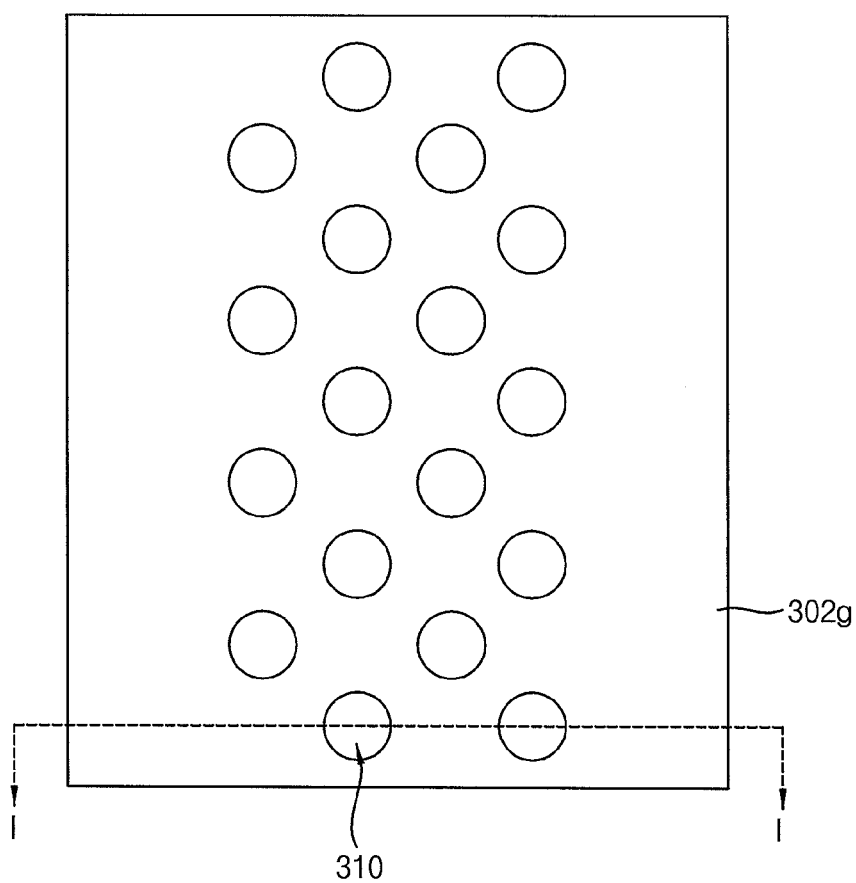
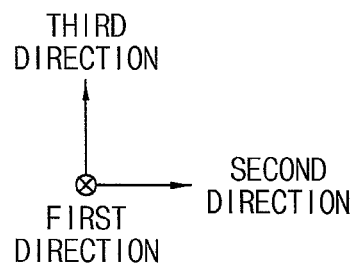

FIG. 28
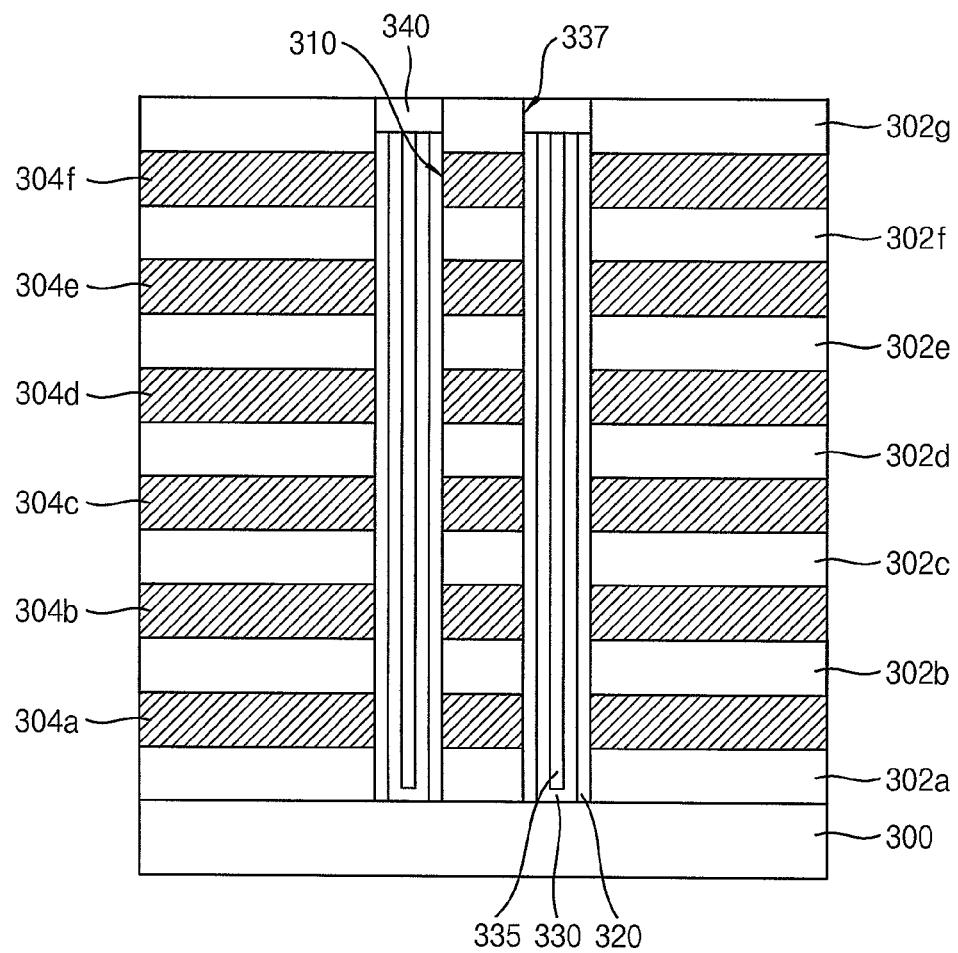
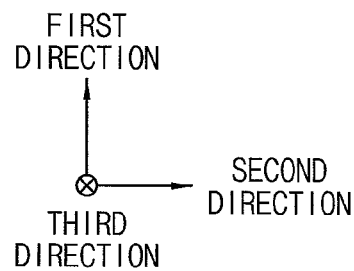

FIG. 30
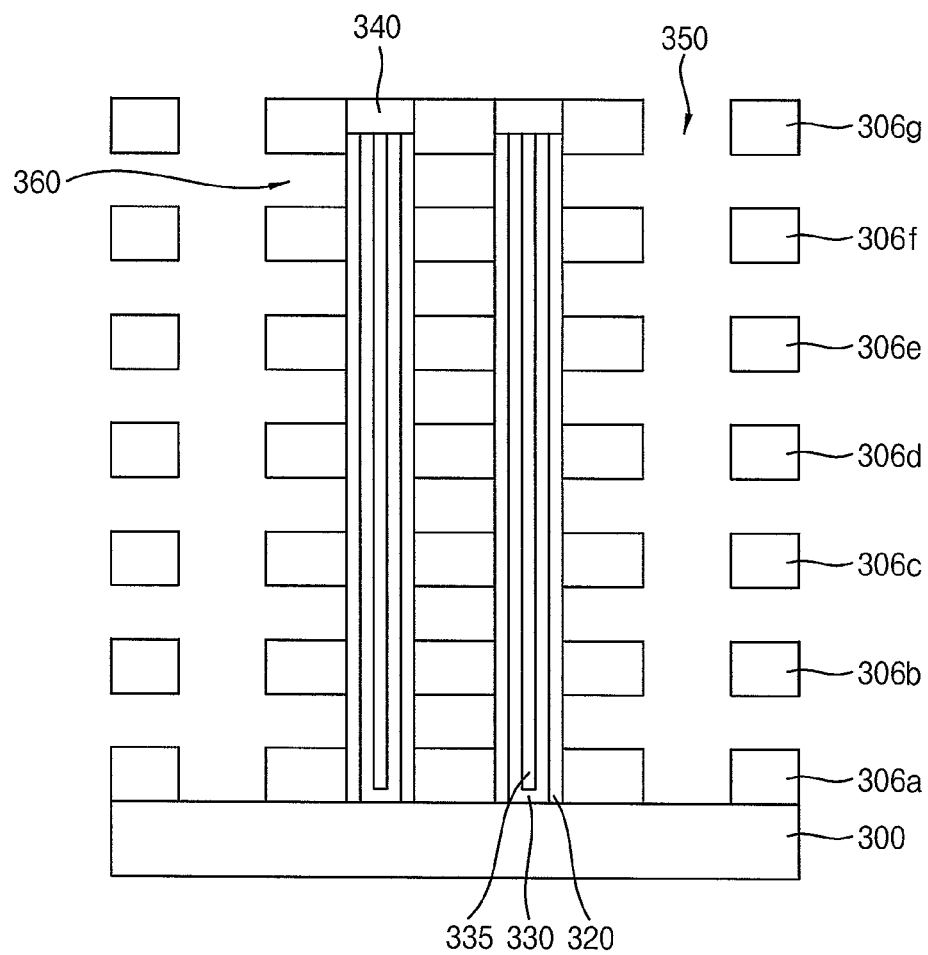
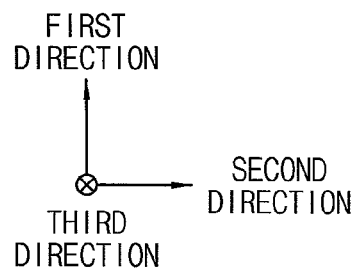

FIG. 33
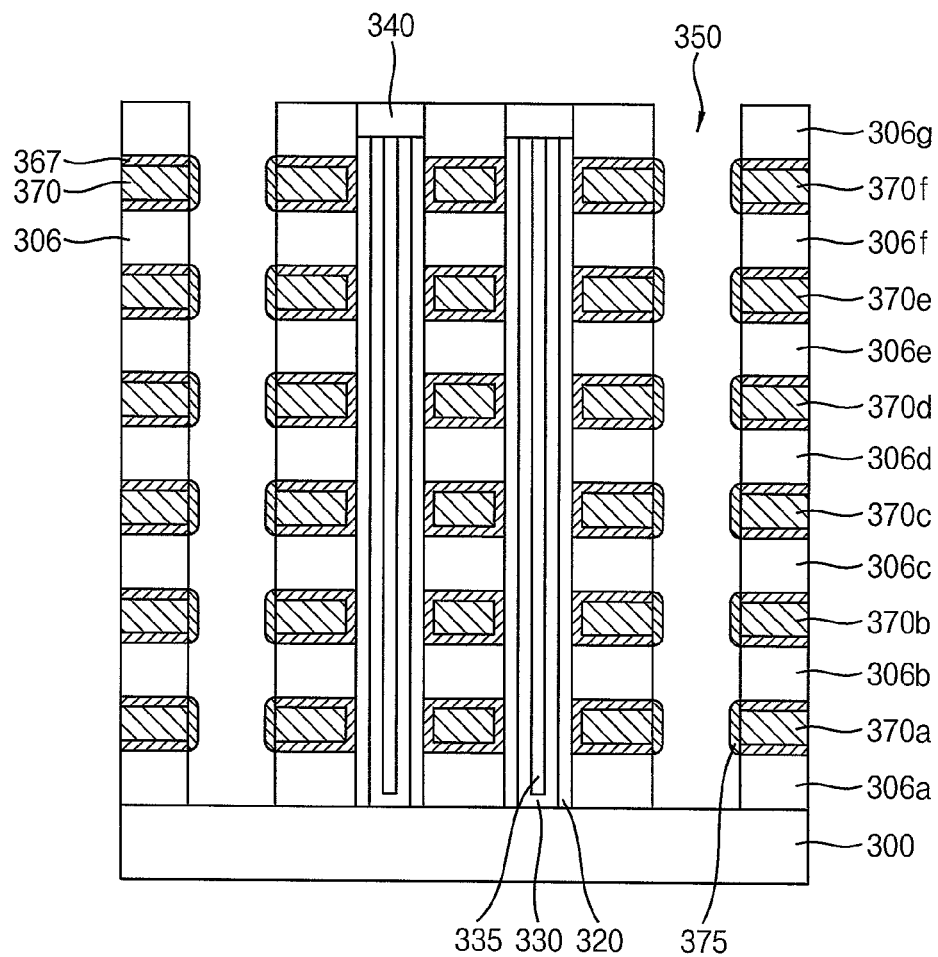
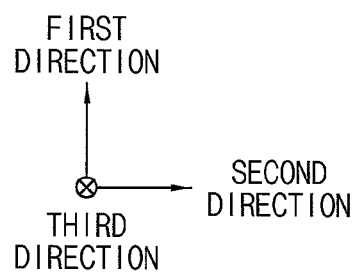

FIG. 36
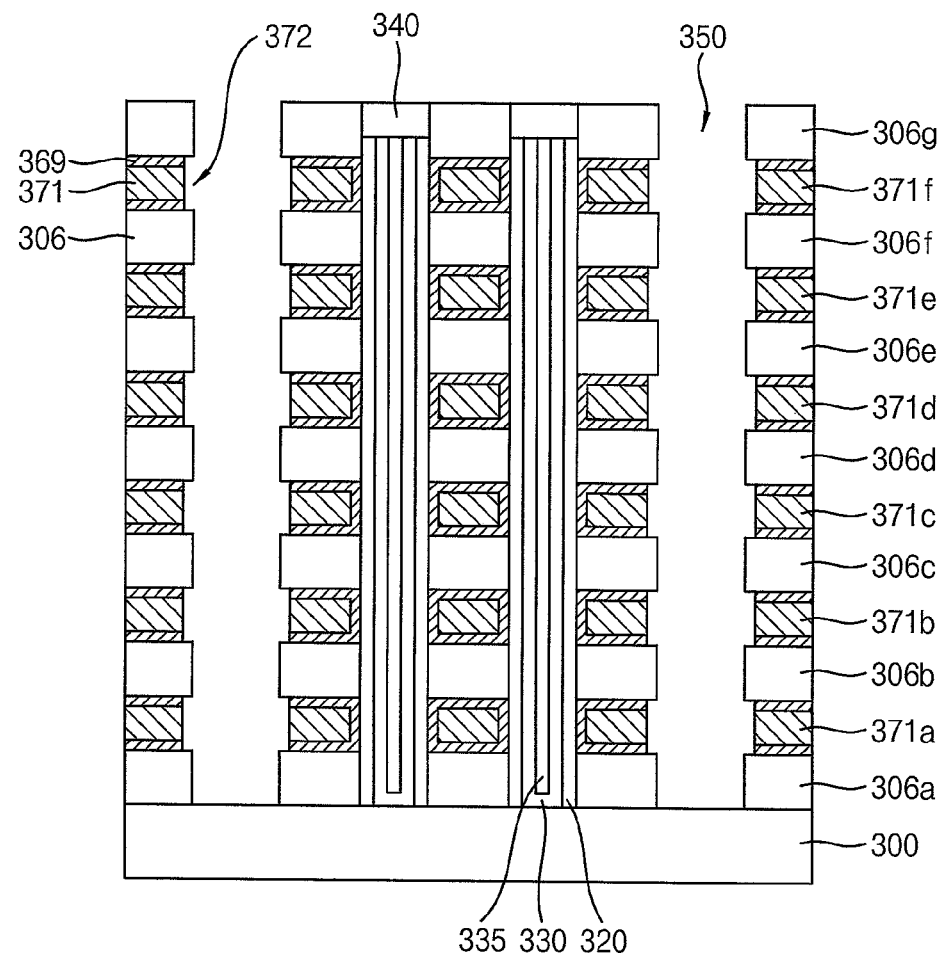
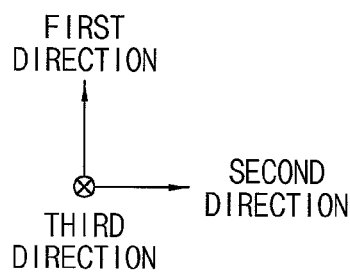

FIG. 38
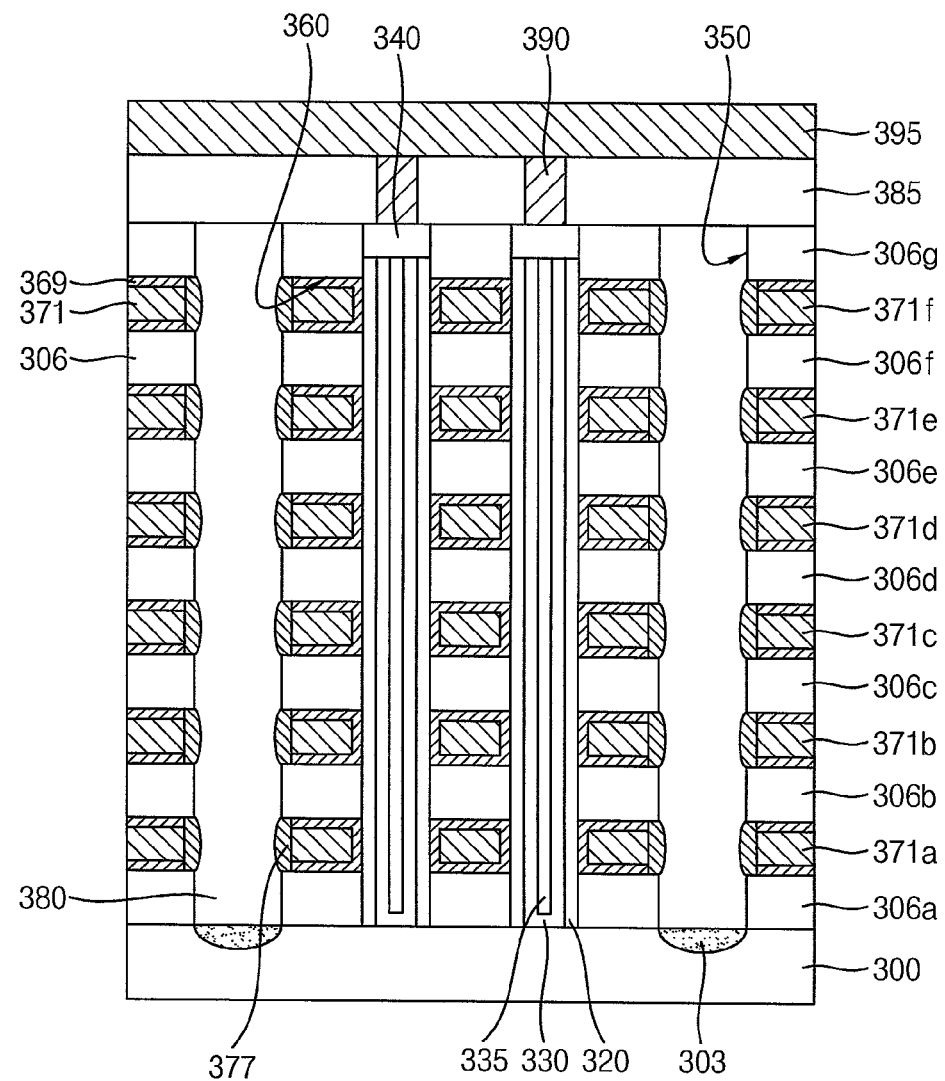
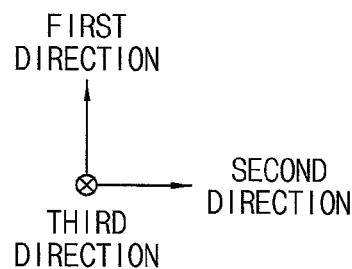

SEMICONDUCTOR DEVICES AND METHODS OF MANUFACTURING THE SAME

CROSS-REFERENCE TO RELATED APPLICATION

This U.S. non-provisional patent application is a divisional of U.S. patent application Ser. No. 15/015,116, filed on Feb. 3, 2016, now U.S. Pat. No. 9,698,231 issued Jul. 4, 2017, which application claims priority under 35 U.S.C. § 119 to Korean Patent Application No. 10-2015-0045245, filed on Mar. 31, 2015 in the Korean Intellectual Property Office (KIPO), the contents of which are incorporated by reference herein in their entirety.

BACKGROUND

Example embodiments relate to semiconductor devices and manufacturing the same. More particularly, example embodiments relate to semiconductor devices including a plurality of gate structures and manufacturing the same.

Non-volatile memory devices may include floating gate-type or charge trap-type flash memory devices. The flash memory device may include a plurality of memory cells, and a degree of integration of the memory cells has been increasing. Accordingly, a distance between the memory cells and a width of each memory cell are decreasing, and methods for maintaining operational reliability of the memory cells have been researched.

SUMMARY

Example embodiments provide semiconductor devices having improved operational reliability.

Example embodiments provide methods of manufacturing semiconductor devices having improved operational reliability.

According to example embodiments, there is provided a semiconductor device. The semiconductor device includes a substrate, a tunnel insulation pattern on the substrate, a charge storage pattern on the tunnel insulation pattern, the charge storage pattern comprising a width in a direction that is substantially perpendicular from a direction of the charge storage pattern from the substrate, a dielectric pattern on the charge storage pattern, the dielectric pattern comprising a width in the direction that is substantially perpendicular from the direction of the charge storage pattern from the substrate, the width of the dielectric pattern being less than a width of the charge storage pattern, a control gate on the dielectric pattern, the control gate comprising a width in the direction that is substantially perpendicular from the direction of the charge storage pattern from the substrate, the width of the control gate being greater than the width of the dielectric pattern, and a metal-containing gate on the control gate.

In example embodiments, the semiconductor device may further comprise a capping layer on a sidewall of the metal-containing gate.

In example embodiments, the capping layer may comprise polysilicon or amorphous silicon.

In example embodiments, the charge storage pattern and the control gate may comprise polysilicon.

In example embodiments, the capping layer may further extend from a sidewall of the control gate in the direction that is substantially perpendicular from the direction of the charge storage pattern from the substrate.

In example embodiments, the semiconductor device may further comprise a gate mask on the metal-containing gate. The capping layer may extend from the sidewall of the control gate only to the sidewall of the metal-containing gate.

In example embodiments, the semiconductor device may further comprise a buffer pattern between the metal-containing gate and the control gate. The capping layer may cover sidewalls of the metal-containing gate and the buffer pattern.

In example embodiments, the buffer pattern may comprise a metal nitride.

In example embodiments, the capping layer may comprise a width in the direction that is substantially perpendicular from the direction of the charge storage pattern from the substrate, and the metal-containing gate may comprise a width in the direction that is substantially perpendicular from the direction of the charge storage pattern from the substrate. A sum of the width of the capping layer and the width of the metal-containing gate may be greater than the width of the control gate.

In example embodiments, the capping layer may comprise a width in the direction that is substantially perpendicular from the direction of the charge storage pattern from the substrate, and the metal-containing gate may comprise a width in the direction that is substantially perpendicular from the direction of the charge storage pattern from the substrate. A sum of the width of the capping layer and the width of the metal-containing gate may be substantially the same as the width of the control gate.

In example embodiments, a plurality of gate structures may be arranged on the substrate. Each of the gate structures may comprise the tunnel insulation pattern, the charge storage pattern, the dielectric pattern, the control gate and the metal-containing gate.

In example embodiments, the tunnel insulation pattern may comprise a protrusion on which the charge storage pattern is disposed. The tunnel insulation pattern may be commonly provided for the plurality of the gate structures.

In example embodiments, each protrusion may comprises a width in the direction that is substantially perpendicular from a direction of the charge storage pattern from the substrate, and the width of each protrusion may be less than the width of the charge storage pattern.

In example embodiments, the semiconductor device may further include a gate spacer covering a sidewall of each gate structure, and an insulating interlayer covering the gate spacer and the plurality of the gate structures.

In example embodiments, a portion of the insulating interlayer between neighboring gate structures of the plurality of the gate structures may comprise an air gap therein.

In example embodiments, the semiconductor device may further include a capping layer on a sidewall of the metal-containing gate. The gate spacer may further cover a sidewall of the capping layer.

In example embodiments, the charge storage pattern may comprise a floating gate.

According to example embodiments, there is provided a semiconductor device. The semiconductor device includes a substrate comprising a top surface, channels extending in a vertical direction from the top surface of the substrate, insulating interlayers and gate lines surrounding the channels and being stacked alternately and repeatedly in the vertical direction in which each gate line comprises a sidewall, a filling pattern separating the insulating interlayers and the gate lines in the vertical direction, and a capping layer on the sidewall of each gate line, the capping layer contacting the filling pattern.

In example embodiments, the gate lines may comprise a metal, the capping layer may comprise a silicon-based material, and the insulating interlayers may comprise an oxide.

In example embodiments, the capping layer may be disposed in the filling pattern. In example embodiments, a gap may be defined in the vertical direction between neighboring insulating interlayers. The each gate line may be disposed in the gap.

In example embodiments, the each gate line may partially fill the gap, and the capping layer may fill a remaining portion of the gap.

In example embodiments, the gap may comprise an inner wall and the barrier pattern comprises sidewalls, and the semiconductor device may further comprise a barrier pattern surrounding the each gate line on the inner wall of the gap. The capping layer may be formed on the sidewalls of the barrier pattern and each gate line.

According to example embodiments, there is provided a method of manufacturing a semiconductor device. In the method, a tunnel insulation layer, a charge storage layer on the tunnel insulation layer, a dielectric layer on the charge storage layer and a control gate layer on the dielectric layer are sequentially formed on a substrate. The control gate layer, the dielectric layer, the charge storage layer and the tunnel insulation layer are etched to form a plurality of gate structures. Each gate structure comprises a tunnel insulation pattern, a charge storage pattern, a dielectric pattern and a control gate. The charge storage pattern comprising sidewalls and the control gate comprising sidewalls. A silicon-based material is provided on the plurality of the gate structures to selectively form a capping layer on the sidewalls of the charge storage pattern and the sidewalls of the control gate.

In example embodiments, the charge storage layer and the control gate layer may comprise polysilicon. In providing the silicon-based material, a deposition time may be controlled between a first time and a second time. The first time may be a deposition-initiating time of the silicon-based material on polysilicon and the second time may be a deposition-initiating time of the silicon-based material on an insulation material.

In example embodiments, the capping layer may comprise a first capping layer formed on the sidewall of the charge storage pattern, and a second capping layer formed on the sidewall of the control gate.

In example embodiments, providing the silicon-based material on the plurality of the gate structures may comprise respectively merging the first capping layer and the second capping layer with the charge storage pattern and the control gate.

In example embodiments, forming a tunnel insulation layer, a charge storage layer, a dielectric layer and a control gate layer may comprise forming a metal-containing gate layer on the control gate layer. The each gate structure may further include a metal-containing gate on the control gate In example embodiments, in providing the silicon-based material, a deposition time may be controlled between a deposition-initiating time of the silicon-based material on a metal-containing material and a deposition-initiating time of the silicon-based material on an insulation material.

In example embodiments, the capping layer may be formed on the metal-containing gate to have a width that is thicker in a direction that is substantially perpendicular to a direction from the metal-containing gate to the tunnel insulation layer than a width of the capping layer on the control gate in the direction that is substantially perpendicular to the direction from the metal-containing gate to the tunnel insulation layer.

According to example embodiments, there is provided a method of manufacturing a semiconductor device. In the method, insulating interlayers and sacrificial layers are formed alternately and repeatedly on a surface of a substrate to form a mold structure. Channels extending through the mold structure are formed in a vertical direction from the surface of the substrate. The mold structure is partially etched to form an opening that separates the mold structure in the vertical direction. The sacrificial layers are replaced with gate lines in which each gate line comprises a sidewall. A capping layer is formed on the sidewall of each gate line exposed by the opening.

In example embodiments, the capping layer may be formed by providing a silicon-based material through the opening to the sidewall of each gate line. A deposition time of the silicon-based material may be controlled between a deposition-initiating time on a metal-containing material and a deposition-initiating time on an insulation material.

In example embodiments, in replacing the sacrificial layers with the gate lines, the sacrificial layers exposed by the opening may be removed to form corresponding gaps. A gate electrode layer filling each respective gap may be formed. The gate electrode layer may be etched to form gate lines partially filling each respective gap. The capping layer may fill a remaining portion of each respective gap.

In example embodiments, a filling pattern may be formed in the opening. The capping layer may be inserted in the filling pattern.

According to example embodiments, there is provided a semiconductor device. The semiconductor device includes a substrate, a gate structure including a tunnel insulation pattern, a charge trap pattern on the tunnel insulation pattern, a blocking pattern on the tunnel insulation pattern and a gate electrode on the blocking pattern sequentially stacked on the substrate in which the gate electrode comprises a sidewall, and a capping layer selectively formed on the sidewall of the gate electrode.

BRIEF DESCRIPTION OF THE DRAWINGS

Example embodiments will be more clearly understood from the following detailed description taken in conjunction with the accompanying drawings. FIGS. 1 to 38 represent non-limiting, example embodiments as described herein.

FIG. 1 is a cross-sectional view illustrating a semiconductor device in accordance with example embodiments;

FIGS. 2 to 7 are cross-sectional views illustrating a method of manufacturing a semiconductor device in accordance with example embodiments;

FIG. 8 is a graph showing a relation between a deposition time and a deposition thickness of a capping layer on a polysilicon layer and a silicon oxide layer;

FIG. 9 is a cross-sectional view illustrating a semiconductor device in accordance with some example embodiments;

FIG. 10 is a cross-sectional view illustrating a semiconductor device in accordance with some example embodiments;

FIG. 11 is a graph showing a relation between a deposition time and a deposition thickness of a capping layer on a metal layer, a polysilicon layer and a silicon oxide layer;

FIG. 12 is a cross-sectional view illustrating a semiconductor device in accordance with some example embodiments;

FIGS. 13 to 17 are cross-sectional views illustrating a method of manufacturing a semiconductor device in accordance with some example embodiments;

FIG. 18 is a cross-sectional view illustrating a semiconductor device in accordance with some example embodiments;

FIG. 19 is a cross-sectional view illustrating a semiconductor device in accordance with some example embodiments;

FIG. 20 is a cross-sectional view illustrating a semiconductor device in accordance with example embodiments;

FIG. 21 is a cross-sectional view illustrating a semiconductor device in accordance with some example embodiments;

FIGS. 22 to 34 are cross-sectional views and top plan views illustrating a method of manufacturing a semiconductor device in accordance with example embodiments; and FIGS. 35 to 38 are cross-sectional views illustrating a method of manufacturing a semiconductor device in accordance with some example embodiments.

DESCRIPTION OF EMBODIMENTS

Figure 1:
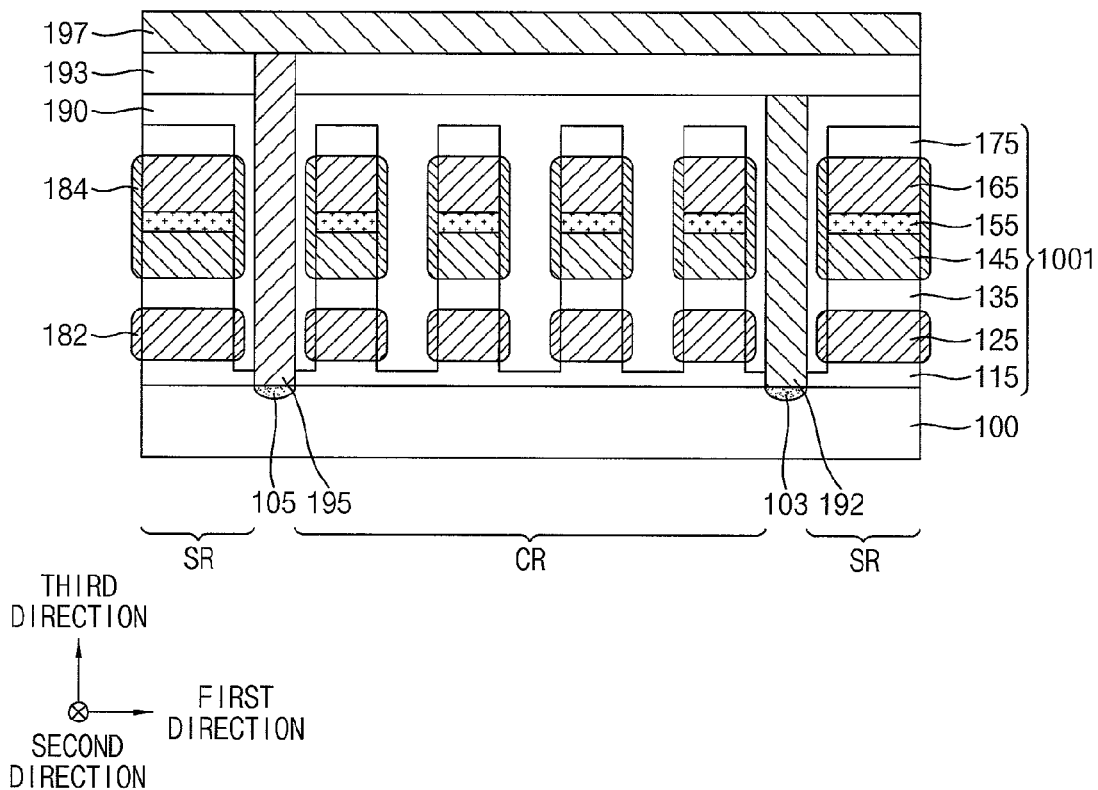

Various example embodiments will be described more fully hereinafter with reference to the accompanying drawings, in which some example embodiments are shown. The subject matter disclosed herein may, however, be embodied in many different forms and should not be construed as limited to the example embodiments set forth herein. Rather, these example embodiments are provided so that this description will be thorough and complete, and will fully convey the scope of the claimed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the subject matter disclosed herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Also, as used herein, the terms such as, but not limited to, "parallel," "perpendicular," "orthogonal," "equal," "regular," "aligned," "flat" and "coplanar" should respectively be understood as "parallel or substantially parallel," "perpendicular or substantially perpendicular," "orthogonal or substantially orthogonal," "equal or substantially equal," "regular or substantially regular," "aligned or substantially aligned," "flat or substantially flat" and "coplanar or substantially coplanar."

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which the subject matter disclosed herein belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device 1000 in accordance with example embodiments. For example, FIG. 1 illustrates a flash memory device of a planar floating gate-type.

Figure 2:
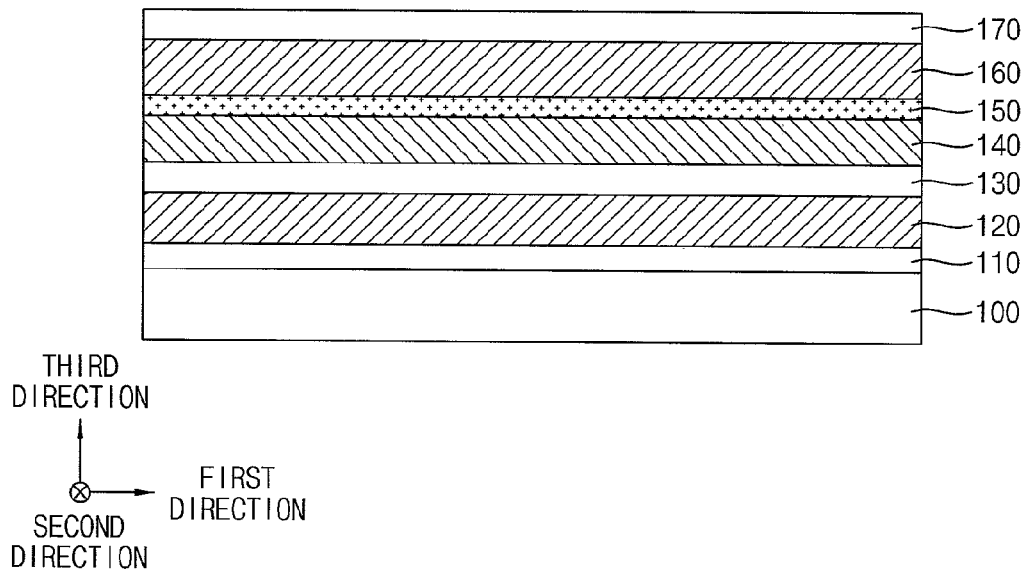

In FIGS. 1 and 2, two directions substantially parallel to a top surface of a substrate and crossing each other are respectively referred to a first direction and a second direction. For example, the first and second directions may be perpendicular to each other. Also in FIGS. 1 and 2, a third direction is shown that is perpendicular to the first and second directions. The definition of the first, second and third directions may be the same in FIGS. 2 to 7, 9, 10, and 12 to 19.

Referring to FIG. 1, the semiconductor device 1000 may include a gate structure 1001 that may include a tunnel insulation pattern 115, a floating gate 125, a dielectric pattern 135 and a control gate 145 sequentially stacked on a substrate 100 in the third direction. The gate structure may further include a metal-containing gate 165 and a gate mask 175 stacked in the third direction on the control gate 145.

At least a portion of the gate structure 1001 may have a linear shape extending substantially in the second direction. A plurality of the gate structures 1001 may be arranged substantially along the first direction. In example embodiments, capping layers 182 and 184 may surround a portion of a sidewall of the gate structure 1001.

The substrate 100 may include a semiconductor substrate, e.g., a silicon substrate, a germanium substrate or a silicon-germanium substrate. A silicon-on-insulator (SOI) substrate or a germanium-on-insulator (GOI) substrate may be also used as the substrate 100. The substrate 100 may include a group III-V compound, such as InP, GaP, GaAs, GaSb, or the like. The substrate 100 may further include p-type and/or n-type wells.

The substrate 100 may be divided into an active region and a field region by a plurality of isolation layers (not illustrated) arranged substantially along the second direction and extending substantially in the first direction. FIGS. 1 to 7, 9, 10, and 12 to 19 are cross-sectional views of devices and/or structures formed on the active region.

The substrate 100 may be also divided into a cell region CR on which memory cells may be arranged, and a selection region SR on which a selection transistor and/or a peripheral circuit may be arranged. For example, in FIG. 1, a central portion of the substrate 100 on which four gate structures having relatively narrow pitch and width may correspond to the cell region CR. Both peripheral portions of the substrate 100 on which a gate structure 1001 having relatively large width may correspond to the selection region SR.

FIG. 1 illustrates that the four gate structures 1001, or four memory cells, are formed on the cell region CR. However, the number of the gate structures formed on the cell region CR may be, e.g., 2n (n is a positive integer) such as, but not limited to, 8 or 16.

The tunnel insulation pattern 115 may have a single-layered structure or a multi-layered structure including, e.g., silicon oxide, silicon nitride and/or silicon oxynitride. In an embodiment, a silicon layer may be interposed in the middle of the multi-layered structure. For example, the tunnel insulation pattern 115 may have an oxide-nitride-oxide (ONO) layered structure, an oxide-silicon-oxide (OSO) structure or an oxide-silicon-nitride-oxide (OSNO) layered structure.

The tunnel insulation pattern 115 may continuously extend substantially along the first direction on the cell region CR. In some embodiments, the tunnel insulation pattern 115 may include a plurality of protrusions 115a (FIG. 3), and the protrusions may be included in the gate structures 1001.

The floating gate 125 may include doped polysilicon. A charge determining a logic state may be stored in the floating gate 125. A plurality of the floating gates 125 may be isolated from each other, and may be arranged substantially along the first and second directions. In example embodiments, the floating gate 125 may substantially serve as a charge-storage pattern.

The dielectric pattern 135 may have a single-layered structure or a multi-layered structure including an oxide layer and/or a nitride layer. For example, the dielectric pattern 135 may have an ONO-layered structure. In some embodiments, the dielectric pattern 135 may include a metal oxide having a high dielectric constant (high-k), such as hafnium oxide, zirconium oxide, aluminum oxide, tantalum oxide, titanium oxide, or the like.

The control gate 145 may include, e.g., doped polysilicon. The control gate 145 may serve as a word line of the semiconductor device.

In example embodiments, the metal-containing gate 165 may be further stacked on the control gate 145. Thus, a resistance of transferring an electrical signal to the control gate 145 may be reduced. For example, the metal-containing gate 165 may include a metal, such as tungsten (W), aluminum (Al), titanium (Ti), tantalum (Ta), copper (Cu), cobalt (Co), nickel (Ni), or the like, or a silicide of the metal.

In some embodiments, a buffer pattern 155 may be interposed between the metal-containing gate 165 and the control gate 145. In example embodiments, the buffer pattern 155 may include a metal nitride, such as tungsten nitride, titanium nitride or tantalum nitride. The buffer pattern 155 may serve as an ohmic pattern for reducing a contact resistance between the metal-containing gate 165 and the control gate 145.

The gate mask 175 may be stacked on the metal-containing gate 165, and may include, e.g., silicon nitride or silicon oxynitride.

In example embodiments, the dielectric pattern 135, the control gate 145, the buffer pattern 155, the metal-containing gate 165 and the gate mask 175 may extend substantially in the second direction on a plurality of the floating gates 125 and the isolation layers. For example, the dielectric pattern 135 may have a substantially wavy shape extending substantially in the second direction along a surface profile of the floating gate 125.

FIG. 1 illustrates that the gate structures on the cell region CR and the selection region SR may have substantially the same stacked structure. However, in an embodiment, the control gate 145 and the floating gate 125 may be at least partially electrically connected to or in contact with each other on the selection region SR.

In example embodiments, a capping layer may be formed selectively on sidewalls of the metal-containing gate 165, the buffer pattern 155, the control gate 145 and the floating gate 125.

The capping layer may include a first capping layer 182 formed on the sidewall of the floating gate 125, and a second capping layer 184 formed on the sidewalls of the metal-containing gate 165, the buffer pattern 155, and the control gate 145.

In example embodiments, the capping layers 182 and 184 may include a silicon-based material, such as polysilicon or amorphous silicon optionally doped with impurities.

The capping layer may not be formed on surfaces of the tunnel insulation pattern 115, the dielectric pattern 135 and the gate mask 175, which may include insulation materials, such as silicon oxide, silicon nitride and/or silicon oxynitride. Thus, the first capping layer 182 and the second capping layer 184 may be substantially separated from each other by the dielectric pattern 135 along a height direction (i.e., the third direction) of the gate structure 1001.

The second capping layer 184 may serve as a barrier blocking generation of a metal residue from the metal-containing gate 165 and the buffer pattern 155. Further, a portion of the second capping layer 184 formed on the sidewall of the control gate 145, and the first capping layer 182 may substantially serve as gate electrodes together with the control gate 145 and the floating gate 125, respectively, so that a larger cell area may be additionally achieved.

A first impurity region 103 and a second impurity region 105 may be formed at upper portions adjacent to some of the gate structures 1001. For example, the first and second impurity regions 103 and 105 may be formed at upper portions of the substrate 100 between the cell region CR and the selection region SR.

A first insulating interlayer 190 may be formed on the substrate 100 and cover the gate structures 1001. A first plug 192 may extend through the first insulating interlayer 190 to be in contact with or electrically connected to the first impurity region 103. In example embodiments, the first plug 192 may serve as a common source line (CSL) or a CSL contact.

A second insulating interlayer 193 may be formed on the first insulating interlayer 190 and may cover the first plug 192. A second plug 195 may extend through the second and first insulating interlayers 190 and 193 to be in contact with or electrically connected to the second impurity region 105. In example embodiments, the second plug 195 may serve as a bit line contact.

The first and second insulating interlayers 190 and 193 may include a silicon oxide-based material, such as plasma enhanced (PEOX), tetraethyl orthosilicate (TEOS), boro tetraethyl orthoSilicate (BTEOS), phosphorous tetraethyl orthoSilicate (PTEOS), boro phospho tetraethyl orthosilicate (BPTEOS), boro silicate glass (BSG), phospho silicate glass (PSG), boro phospho silicate glass (BPSG), etc.

The first and second plugs 192 and 195 may include a conductive material, such as a metal, a metal nitride or a metal silicide.

For example, a bit line 197 electrically connected to the second plug 195 may be disposed on the second insulating interlayer 193. The bit line 197 may extend substantially in the first direction and a plurality of the bit lines 197 may be arranged substantially along the second direction. The bit line 197 may include a conductive material, such as a metal, a metal nitride or a metal silicide.

FIGS. 2 to 7 are cross-sectional views illustrating a method of manufacturing a semiconductor device in accordance with example embodiments. For example, FIGS. 2 to 7 illustrate a method of manufacturing a semiconductor device of FIG. 1.

Referring to FIG. 2, a tunnel insulation layer 110, a floating gate layer 120, a dielectric layer 130, a control gate layer 140, a buffer layer 150, a metal-containing gate layer 160 and a gate mask layer 170 may be sequentially formed on a substrate 100 in the third direction.

The substrate 100 may include a silicon substrate, a silicon substrate, a germanium substrate, a silicon-germanium substrate or an SOI substrate or a GOI substrate. The substrate 100 may include a group III-V compound, such as InP, GaP, GaAs, GaSb, or the like.

The tunnel insulation layer 110 may be formed of silicon oxide, silicon nitride and/or silicon oxynitride. In some embodiments, the tunnel insulation layer 110 may be formed as a multi-layered structure, such as an ONO-layered structure, an OSO-layered structure or an OSNO-layered structure. The floating gate layer 120 may be formed by a deposition process using a silicon precursor, and p-type or n-type impurities. The floating gate layer 120 may be formed of doped polysilicon. The floating gate layer 120 may substantially serve as a charge storage layer.

In some embodiments, after the formation of the floating gate layer 120, the floating gate layer 120, the tunnel insulation layer 110 and an upper portion of the substrate 100 may be partially etched substantially along the first direction to form an isolation trench (not illustrated). A plurality of the isolation trenches may be formed substantially along the second direction. The substrate 100 may be divided into an active region and a field region by the isolation trench. An isolation layer (not illustrated) partially filling the isolation trench may be formed of, e.g., silicon oxide. The floating gate layer 120 and the tunnel insulation layer 110 may be converted into linear patterns extending substantially in the first direction on the active region by the above-mentioned process.

Subsequently, the dielectric layer 130, the control gate layer 140, the buffer layer 150, the metal-containing gate layer 160 and the gate mask layer 170 may be sequentially formed in the third direction on the floating gate layer 120 and the isolation layer.

The dielectric layer 130 may be formed as a single-layered structure of an oxide layer or a nitride layer, or a multi-layered structure, such as an ONO-layered structure. In an embodiment, the dielectric layer 130 may be formed of a high-k metal oxide. The control gate layer 140 may be formed of doped polysilicon. The buffer layer 150 may be formed of a metal nitride, such as tungsten nitride, titanium nitride or tantalum nitride. The metal-containing gate layer 160 may be formed of a metal, such as W, Al, Ti, Ta, Cu, Co or Ni, or a nitride of the metal. The gate mask layer 170 may be formed of silicon nitride or silicon oxynitride.

The tunnel insulation layer 110, the floating gate layer 120, the dielectric layer 130, the control gate layer 140, the buffer layer 150, the metal-containing gate layer 160 and the gate mask layer 170 may be formed by, e.g., at least one of a chemical vapor deposition (CVD) process, a plasma enhanced chemical vapor deposition (PECVD) process, a sputtering process, a physical vapor deposition (PVD) process and an atomic layer deposition (ALD) process.

Referring to FIG. 3, the gate mask layer 170 may be partially etched along substantially the second direction to form a plurality of gate masks 175. The metal-containing gate layer 160, the buffer layer 150, the control gate layer 140, the dielectric layer 130, the floating gate layer 120 and the tunnel insulation layer 110 may be sequentially and partially etched using the gate masks 175 as an etching mask.

Accordingly, gate structures, each of which may include a tunnel insulation pattern 115, a floating gate 125, a dielectric pattern 135, a control gate 145, a buffer pattern 155, a metal-containing gate 165 and the gate mask 175 may be formed sequentially stacked on a top surface of the substrate 100 in the third direction.

A portion of each gate structure, for example, the dielectric pattern 135, the control gate 145, the buffer pattern 155, the metal-containing gate 165 and the gate mask 175 may have linear shapes continuously extending substantially in the second direction. The floating gates 125 may have an island shape spaced apart from each other along the first and second directions.

The tunnel insulation pattern 115 may linearly extend substantially in the first direction. The tunnel insulation pattern 115 may not be completely separated between the gate structures neighboring each other by the above etching process. Accordingly, the tunnel insulation pattern 115 may include protrusions 115a included in the gate structures, and recessed portions 115b between the protrusions.

In example embodiments, a plurality of the gate structures 1001 may be formed along the first direction. For example, a central portion of the substrate 100 may correspond to a cell region. The gate structures 1001 may be formed on the cell region CR by relatively narrow width and pitch, and may serve as memory cells. FIG. 3 illustrates that four gate structures 1001 are formed on the cell region CR. However, the number of the gate structures 1001 on the cell region CR may not be specifically limited.

Peripheral portions of the substrate adjacent to the cell region CR may correspond to a selection region SR. The gate structures may be formed on the selection region SR by relatively large width and pitch.

In some embodiments, the floating gate 125 and the control gate 145 of the gate structure 1001 formed on the selection region SR may be electrically connected to or in contact with each other. In this case, portions of the floating gate layer 120 and the control gate layer 140 on the selection region SR may be connected to each other by a butting process during a process illustrated with reference to FIG. 2.

Referring to FIG. 4, a capping layer 182, 184 may be formed on a sidewall of portions of each gate structure 1001.

In example embodiments, the capping layer 182, 184 may be formed by a CVD process or an ALD process in which a silicon precursor, such as chloro silane may be utilized. In some embodiments, n-type or p-type impurities may be also provided during the deposition process.

Accordingly, the capping layer 182, 184 may be formed of a silicon-based material, such as polysilicon or amorphous silicon optionally doped with the impurities. The silicon-based material may be deposited by a greater affinity on polysilicon, a metal and a metal nitride than on an insulation material. Thus, the capping layer 182, 184 may be formed selectively on sidewalls of the floating gate 125, the control gate 145, the buffer pattern 155 and the metal-containing gate 165.

In example embodiments, a first capping layer 182 may be formed on the sidewall of the floating gate 125, and a second capping layer 184 may be formed on the sidewalls of the control gate 145, the buffer pattern 155 and the metal-containing gate 165.

In example embodiments, a plurality of the first capping layers 182 may be spaced apart from each other along the second direction corresponding to an arrangement of the floating gates 125. The second capping layer 184 may commonly cover the sidewalls of the control gate 145, the buffer pattern 155 and the metal-containing gate 165, and may continuously extend in the second direction. The first capping layer 182 and the second capping layer 184 may be separated from each other along a height direction (i.e., the third direction) of the gate structure 1001 by the dielectric pattern 135.

Referring to FIG. 5, a first insulating interlayer 190 covering the gate structures 1001 may be formed on the tunnel insulation pattern 115 and the isolation layer. The first insulating interlayer 190 may be formed of silicon oxide, such as PEOX-based, TEOS-based or silicate glass-based materials.

In a comparative example, when the capping layer 184 is omitted, the sidewalls of the metal-containing gate 165 and/or the buffer pattern 155 are exposed. As a result, metal components may be detached from the sidewalls and migrated by a high deposition temperature while forming, e.g., the first insulating interlayer 190. For example, the metal components may be migrated toward the dielectric pattern 135 and/or the tunnel insulation pattern 115 to disturb or deteriorate electrical properties of the memory cells. Electrical operation failures caused by the migration of the metal components may be exacerbated as a distance between the memory cells decreases.

Additionally, the sidewalls of the metal-containing gate 165, the buffer pattern 155, the control gate 145 and the floating gate 125 may be oxidized by an oxidizing agent used in the deposition process. In this case, a gate area or a cell area may be reduced, and a programming voltage or an erase voltage for an operation of the semiconductor device may increase.

However, according to example embodiments, the sidewalls of the metal-containing gate 165, the buffer pattern 155, and the control gate 145, and the floating gate 125 may be respectively covered by the first and capping layers 184 and 182 to avoid a reduction of the cell area by the oxidizing agent and a contamination by the migration of the metal components. Further, the first and second capping layers 182 and 184 may serve as gate electrodes together with the floating gate 125 and the control gate 145, respectively, to obtain a larger cell area.

Referring to FIG. 6, a first plug 192 may be formed through the first insulating interlayer 190 to be in contact with or electrically connected to a first impurity region 103.

For example, portions of the first insulating interlayer 190 and the tunnel insulation pattern 115 formed between the cell region CR and the selection region SR may be etched to form a first opening. A first impurity may be implanted through the first opening to form the first impurity region 103 at an upper portion of the substrate 100. A first conductive layer filling the first opening may be formed on the first insulating interlayer 190, and an upper portion of the first conductive layer may be planarized by, e.g., a chemical mechanical polish (CMP) process to form the first plug 192. The first plug 192 may serve as a CSL or a CSL contact of the semiconductor device.

Figure 7:
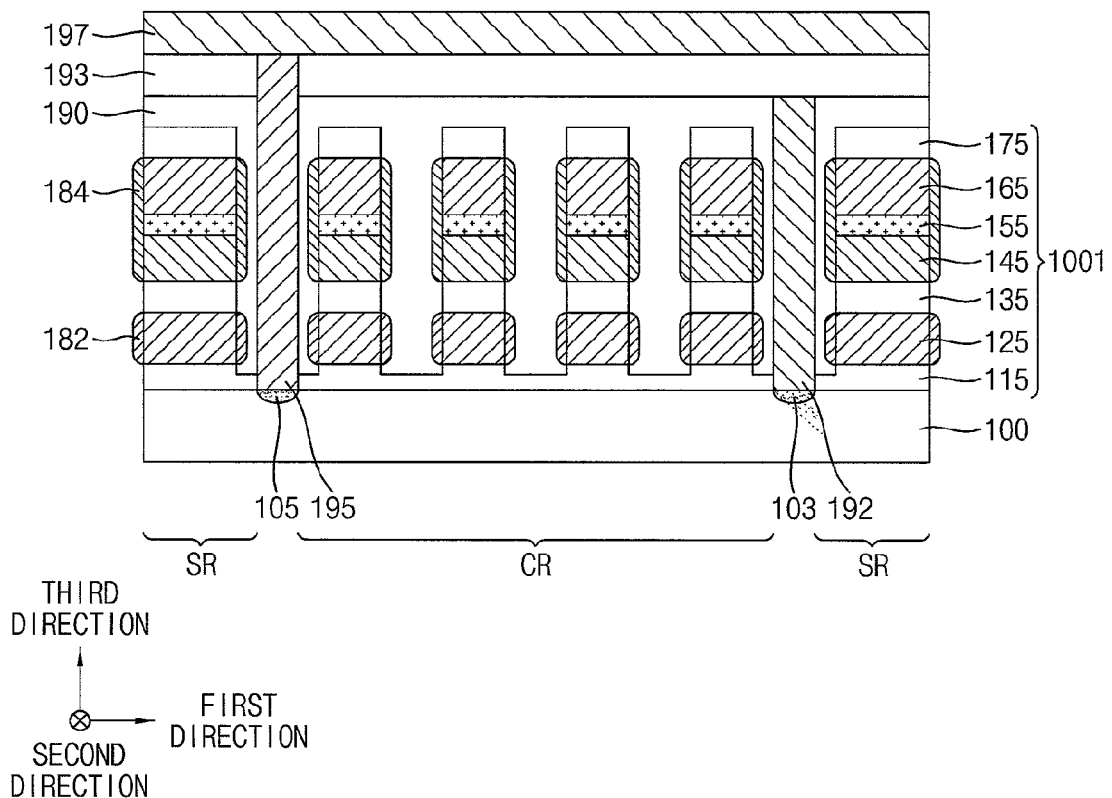

Referring to FIG. 7, a second insulating interlayer 193 may be formed on the first insulating interlayer 190 to cover the first plug 192. The second insulating interlayer 193, the first insulating interlayer 190 and the tunnel insulation pattern 115 may be partially etched to form a second opening between the cell region CR and the selection region SR of the substrate 100. A second impurity may be implanted through the second opening to form a second impurity region 105 at an upper portion of the substrate 100.

A second conductive layer filling the second opening may be formed on the second insulating interlayer 193, and an upper portion of the second conductive layer may be planarized by a CMP process to form a second plug 195.

A third conductive layer may be formed on the second insulating interlayer 193 and the second plug 195, and may be patterned to form a bit line 197. For example, the bit line 197 may extend in the first direction. The second plug 195 may be electrically connected to the bit line 197, and may serve as a bit line contact.

The second insulating interlayer 193 may be formed of silicon oxide substantially the same as or similar to that of the first insulating interlayer 190. The first to third conductive layers may be formed of a metal, a metal nitride or a metal silicide by, e.g., a sputtering process or an ALD process.

Figure 8:
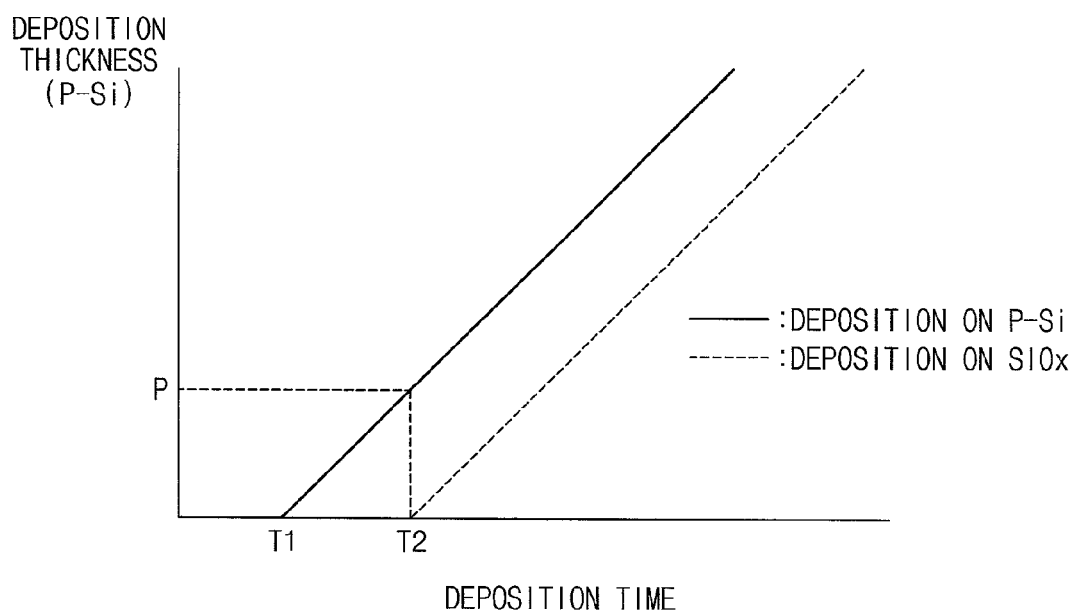

FIG. 8 is a graph showing a relation between a deposition time and a deposition thickness of a capping layer on a polysilicon layer and a silicon oxide layer. For example, FIG. 8 is a graph for illustrating a selective formation mechanism of the capping layers 182 and 184 as described with reference to FIG. 4.

Referring to FIG. 8, a deposition thickness of a capping layer including polysilicon (P—Si) may increase as a deposition time increases. For example, a deposition of the capping layer on a layer or a pattern including polysilicon, such as the floating gate 125 and the control gate 145, may be initiated at a first time T1, and then a deposition thickness may linearly increase as time increases. A deposition of the capping layer on an insulation layer or an insulation pattern (including, e.g., silicon oxide (SiOx)), such as the dielectric pattern 135 and the tunnel insulation pattern 115, may be initiated at a second time T2, and then a deposition thickness may linearly increase as time increases.

Thus, the deposition time of the capping layer may be controlled so that the capping layers 182 and 184 may be formed selectively on the sidewalls of the metal-containing gate 165, the buffer pattern 155, the control gate 145 and the floating gate 125, as illustrated in FIG. 4. For example, the deposition time of the capping layer may be set between the first time T1 and the second time T2, so that the capping layer may be selectively formed having a thickness less than that indicated as "P" in y-axis of FIG. 8. The deposition time may be limited less than about the second time T2, and thus the capping layer may not be formed on surfaces of the gate mask 175, the dielectric pattern 135 and the tunnel insulation pattern 115. Therefore, an operational disturbance may be prevented that is caused if the capping layer extends on the gate mask 175, the dielectric pattern 135 and the tunnel insulation pattern 115.

Figure 9:
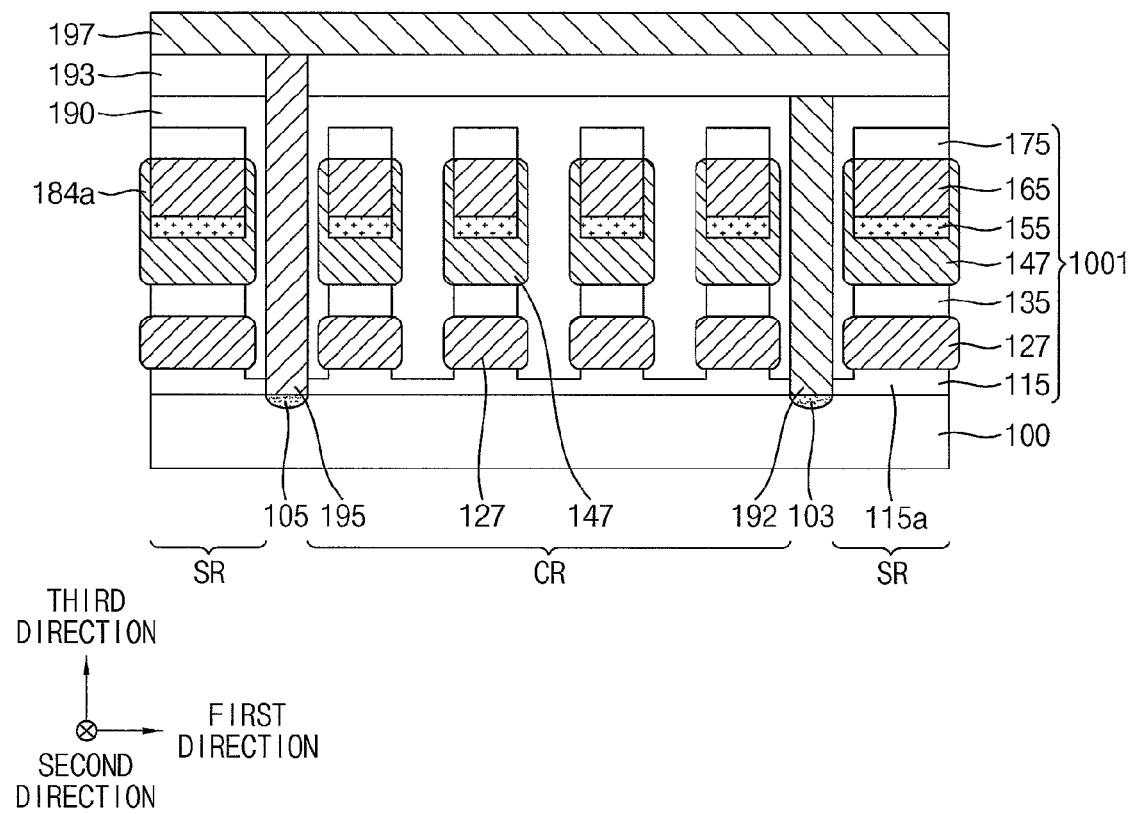

FIG. 9 is a cross-sectional view illustrating a semiconductor device 2000 in accordance with some example embodiments. The semiconductor device 2000 of FIG. 9 may have elements and/or constructions substantially the same as or similar to those of the semiconductor device 1000 illustrated in FIG. 1 except for structures or shapes of a capping layer, a control gate and a floating gate. Thus, detailed descriptions on repeated elements and structures are omitted herein, and like reference numeral are used to designate like elements.

Referring to FIG. 9, the first capping layer 182 and the floating gate 125 illustrated in FIG. 1 may include, e.g., substantially the same polysilicon. Accordingly, the first capping layer 182 and the floating gate 125 may be substantially merged with each other to be a single or unitary member. Thus, the floating gate 125 of FIG. 1 may be transformed into an expanded floating gate 127 having increased width or cross-sectional area as illustrated in FIG. 9. The expanded floating gate 127 may have a width in the first direction that is greater than the width in the first direction of the dielectric pattern 135 and the protrusion 115a of the tunnel insulation pattern 115.

The second capping layer 184 of FIG. 1 may include, e.g., substantially the same polysilicon as that of the control gate 145. Accordingly, a portion of the second capping layer 184 in contact with the control gate 145 may be substantially merged with the control gate 145 to be a single or unitary member. Thus, the control gate 145 of FIG. 1 may be transformed into an expanded control gate 147 having increased width in the first direction or cross-sectional area. The expanded control gate 147 may have a width in the first direction that is greater than the width in the first direction of the dielectric pattern 135 and the gate mask 175. Further, a second capping layer 184a extending from a lateral portion of the expanded control gate 147 and covering sidewalls of the buffer pattern 155 and the metal-containing gate 165 may be formed.

Figure 10:
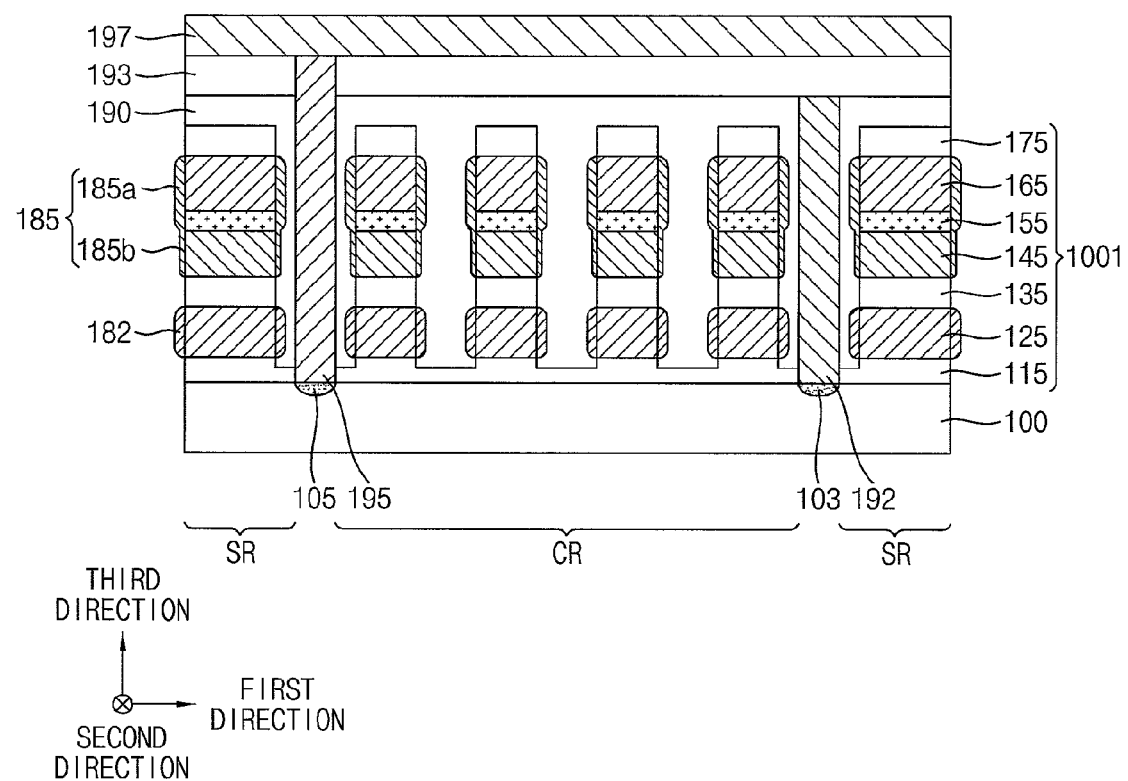

FIG. 10 is a cross-sectional view illustrating a semiconductor device 3000 in accordance with some example embodiments. The semiconductor device 3000 of FIG. 10 may have elements and/or constructions substantially the same as or similar to those of the semiconductor device 1000 illustrated in FIG. 1 except for a structure or a shape of a capping layer. Thus, detailed descriptions on repeated elements and structures are omitted herein, and like reference numeral are used to designate like elements.

Referring to FIG. 10, a second capping layer 185 may include a first portion 185a covering sidewalls of the metal-containing gate 165 and the buffer pattern 155, and a second portion 185b covering a sidewall of the control gate 145. The first and second portions 185a and 185b may be substantially merged with each other to be a single or unitary member.

In example embodiments, the second capping layer 185 may be formed with a greater affinity on the metal-containing gate 165 and the buffer pattern 155 than on the control gate 145. Thus, the first portion 185a may have a thickness or a width in the first direction that is greater than the width in the first direction of the second portion 185b. Therefore, diffusion or migration of metal components from the metal-containing gate 165 and/or the buffer pattern 155 may be blocked more effectively.

In some embodiments, the second portion 185b of the second capping layer 185 may have a thickness or a width in the first direction that is substantially the same as the thickness or width in the first direction of the first capping layer 182.

Figure 11:
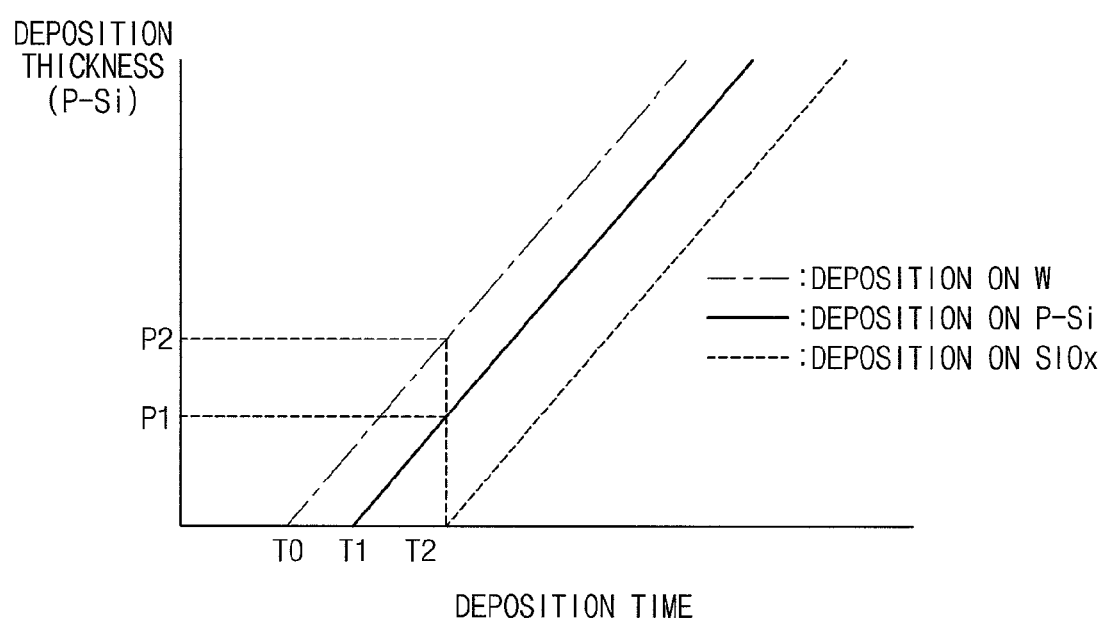

FIG. 11 is a graph showing a relation between a deposition time and a deposition thickness of a capping layer on a metal layer, a polysilicon layer and a silicon oxide layer. For example, FIG. 11 is a graph for illustrating a formation mechanism of the second capping layer 185, as described with reference to FIG. 10.

Referring to FIG. 11, a deposition thickness of a capping layer including, e.g., polysilicon (P-Si), may increase as a deposition time increases. For example, a deposition of the capping layer on the metal-containing gate 165 and the buffer pattern 155 including, e.g., tungsten (W) may begin at an initial time T0, and then a deposition thickness may linearly increase as time increases.

A deposition of the capping layer on the floating gate 125 and the control gate 145 including polysilicon may begin at a first time T1, and then a deposition thickness may linearly increase as time increases. A deposition of the capping layer on an insulation layer or an insulation pattern (including, e.g., silicon oxide (SiOx)), such as the dielectric pattern 135 and the tunnel insulation pattern 115, may begin at a second time T2, and then a deposition thickness may linearly increase as time increases.

Thus, the deposition time of the capping layer may be controlled so that the second capping layer 185 may be divided into the first portion 185a and the second portion 185b having different thicknesses in the first direction, as illustrated in FIG. 10. For example, the deposition time of the capping layer may be set between the first time T1 and the second time T2.

In this case, the first portion 185a of the second capping layer 185 may be deposited to have a thickness in the first direction between a first thickness P1 and a second thickness P2, and the second portion 185b may be deposited to have a thickness in the first direction that is less than the first thickness P1. The first capping layer 182 may be also deposited on a sidewall of the floating gate 125 to have the thickness in the first direction that is less than the first thickness P1. As also described with reference to FIG. 8, the surfaces of the gate mask 175, the dielectric pattern 135 and the tunnel insulation pattern 115 may have substantially no deposited capping layer.

Figure 12:
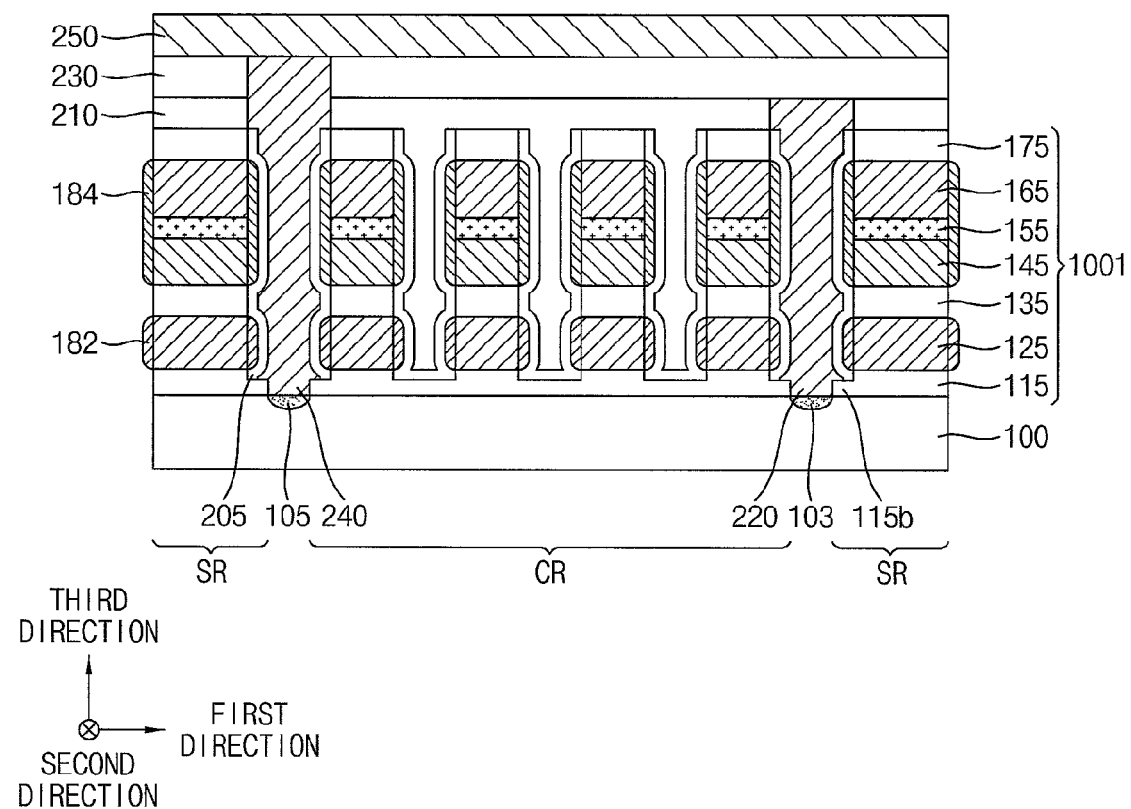

FIG. 12 is a cross-sectional view illustrating a semiconductor device 4000 in accordance with some example embodiments. The semiconductor device 4000 of FIG. 12 may have elements and/or constructions substantially the same as or similar to those of the semiconductor device 1000 illustrated in FIG. 1 except for an addition of a gate spacer. Thus, detailed descriptions on repeated elements and structures are omitted herein, and like reference numeral are used to designate like elements.

Referring to FIG. 12, a gate spacer 205 may be formed on the gate structure 1001 and the capping layer. In example embodiments, the gate spacer 205 may be formed on sidewalls of the gate mask 175, the second capping layer 184, the dielectric pattern 135, the first capping layer 182, and a protrusion of the tunnel insulation pattern 115.

In some embodiments, the gate spacer 205 on a cell region CR may be formed continuously and conformally along sidewalls of the gate structures 1001 and the capping layer facing in the first direction, and a surface of a recessed portion 115b of the tunnel insulation pattern 115. For example, the gate spacer 205 on the cell region CR may have a ditch shape extending substantially in the second direction.

The gate spacer 205 may include ALD oxide, low temperature oxide (LTO), or middle temperature oxide (MTO), which may have an improved step coverage property. Alternatively, the gate spacer 205 may include silicon nitride or silicon oxynitride.

A first plug 220 may extend through a first insulating interlayer 210 and the tunnel insulation pattern 115 between the cell region CR and a selection region SR to be electrically connected to the first impurity region 103. In some embodiments, the first plug 220 may be in contact with the gate spacer 205.

A second plug 240 may extend through a second insulating interlayer 230, the first insulating interlayer 210 and the tunnel insulation pattern 115 between the cell region CR and the selection region SR to be electrically connected to the second impurity region 105. In some embodiments, the second plug 240 may be in contact with the gate spacer 205.

A bit line 250 electrically connected to the second plug 240 may be disposed on the second insulating interlayer 230.

FIGS. 13 to 17 are cross-sectional views illustrating a method of manufacturing a semiconductor device in accordance with some example embodiments. For example, FIGS. 13 to 17 illustrate a method of manufacturing the semiconductor device 4000 of FIG. 12.

Detailed descriptions on processes and materials substantially the same as or similar to those illustrated with reference to FIGS. 2 to 8 are omitted herein.

Figure 13:
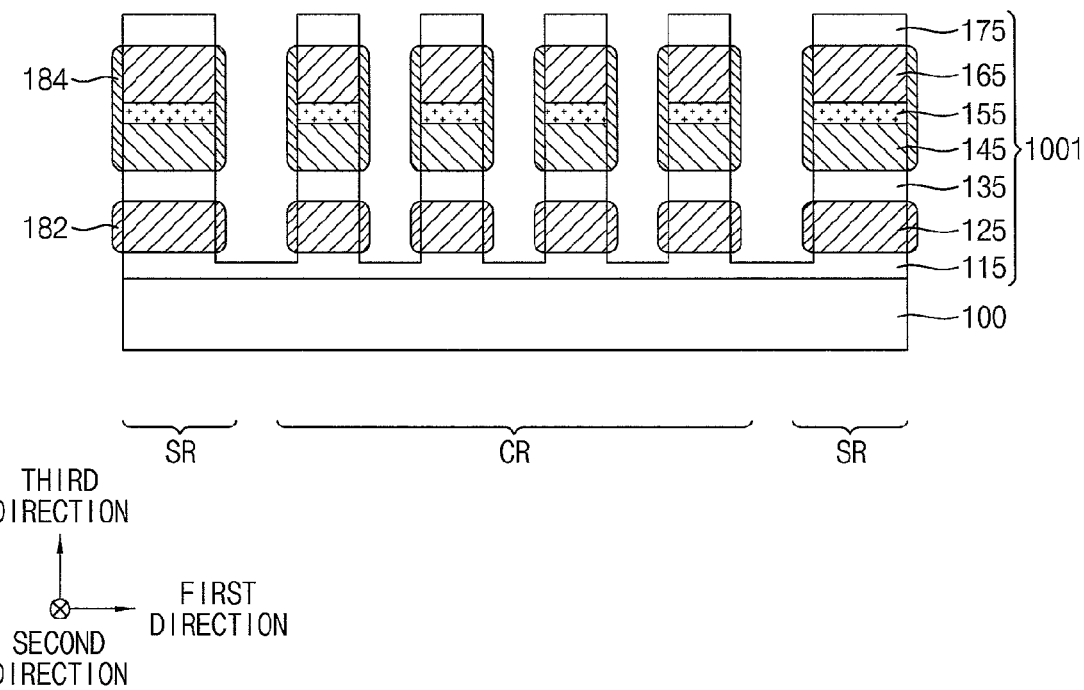

Referring to FIG. 13, processes substantially the same as or similar to those illustrated with reference to FIGS. 2 to 4 may be performed.

Accordingly, as illustrated in FIGS. 2 and 3, a plurality of gate structures 1001, each of which may include a tunnel insulation pattern 115, a floating gate 125, a dielectric pattern 135, a control gate 145, a buffer pattern 155, a metal-containing gate 165 and a gate mask 175 may be formed on a substrate 100. As illustrated in FIG. 4, a capping layer 182, 184 may be formed on a portion of a sidewall of the gate structure. A first capping layer 182 may be formed on a sidewall of the floating gate 125, and a second capping layer 184 may be formed on sidewalls of the control gate 145, the buffer pattern 155 and the metal-containing gate 165.

Figure 14:
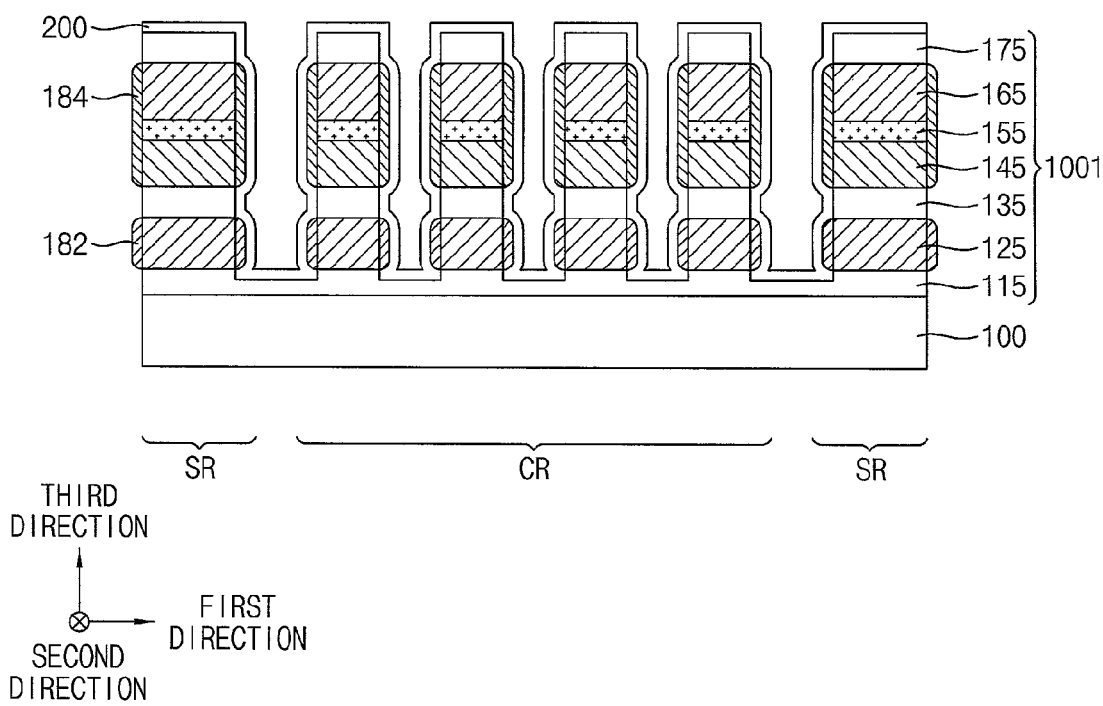

Referring to FIG. 14, a gate spacer layer 200 may be formed along surface of the gate structures 1001 and the capping layers 182 and 184.

The gate spacer layer 200 may be formed conformally and continuously on sidewalls of the gate structures and the capping layers 182 and 184, a top surface of the gate mask 175, and surfaces of the tunnel insulation pattern 115 between the neighboring gate structures 1001 in the first and second directions.

In example embodiments, the gate spacer layer 200 may be formed of an insulation material that may have an improved step coverage property and may be deposited at a low temperature. For example, the gate spacer layer 200 may be formed of ALD oxide, LTO or MTO. In some embodiments, the gate spacer layer 200 may be formed of silicon nitride or silicon oxynitride.

Figure 15:
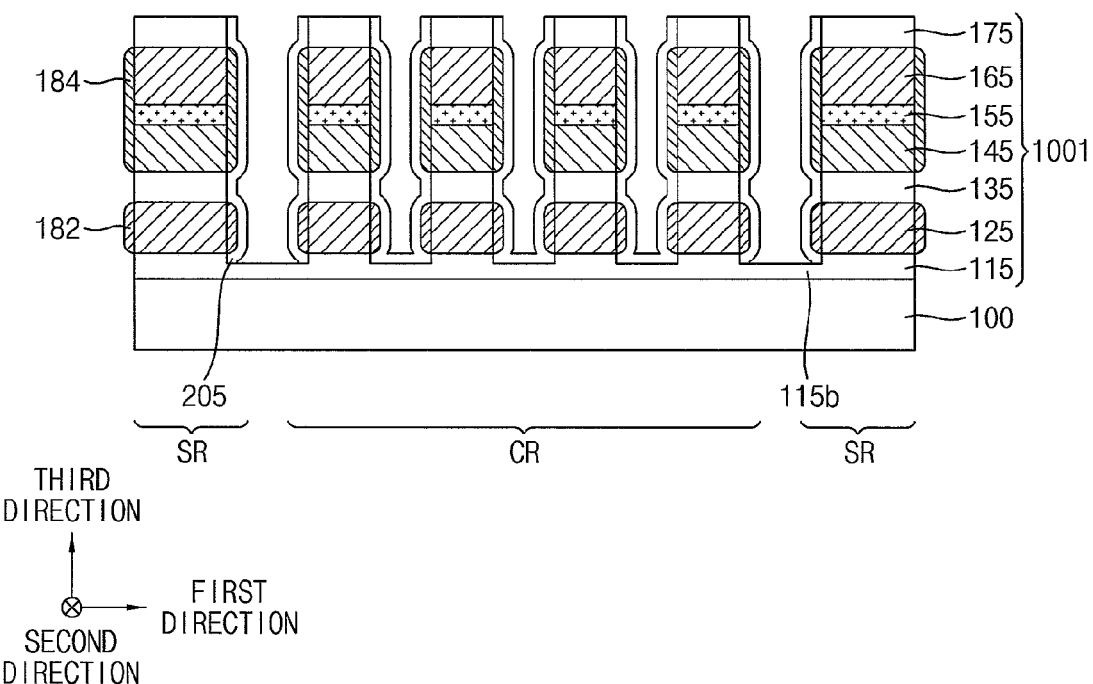

Referring to FIG. 15, the gate spacer layer 200 may be partially removed by, e.g., an etch-back process to form a gate spacer 205.

A portion of the gate spacer layer 200 formed on the top surface of the gate mask 175 may be removed by the etch-back process. In some embodiments, a portion of the gate spacer layer 200 formed between the cell region CR and the selection region SR, which may be spaced apart by a relatively wide distance, may be also removed.

Accordingly, the gate spacer 205 may be formed on sidewalls of the gate mask 175, the second capping layer 184, the dielectric pattern 135, the first capping layer 182 and a protrusion of the tunnel insulation pattern 115. In some embodiments, the gate spacer 205 may be formed continuously along sidewalls of the gate structures 1001 facing in the first direction, and a surface of a recessed portion 115b of the tunnel insulation pattern 115 on the cell region CR.

In some embodiments, the tunnel insulation pattern 115 may be exposed through the neighboring gate spacers 205 between the cell region CR and the selection region SR.

Figure 16:
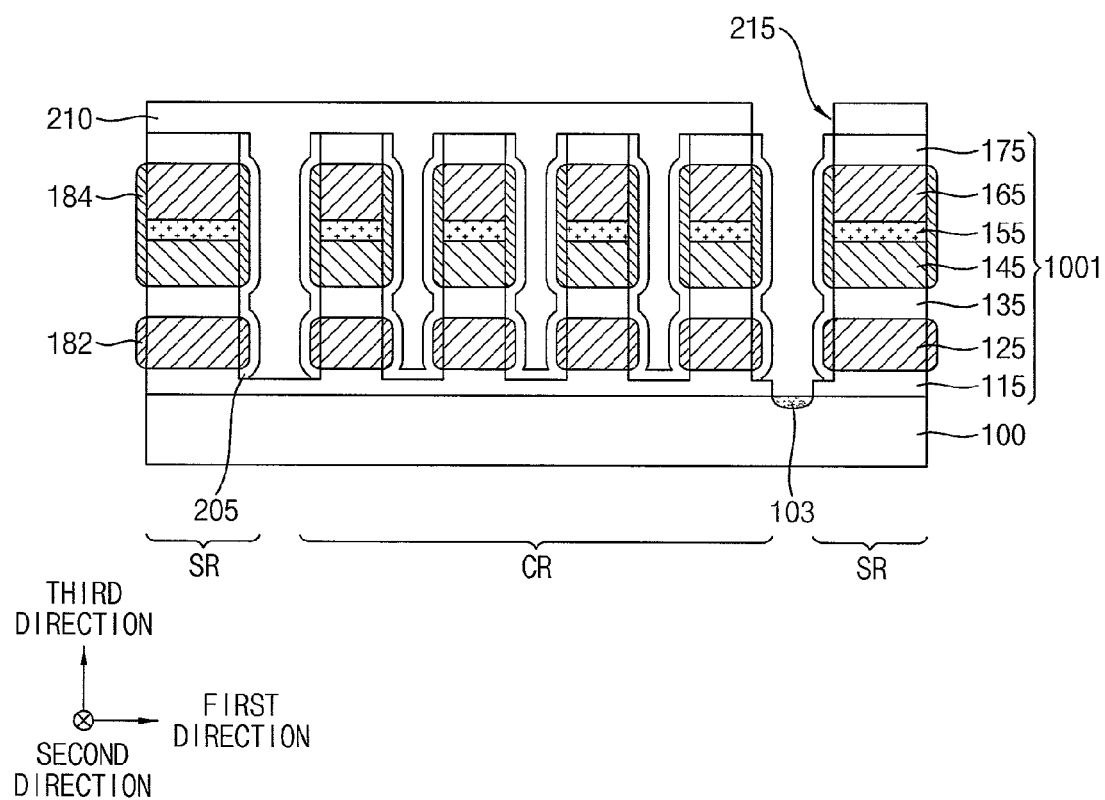

Referring to FIG. 16, a first insulating interlayer 210 covering the gate structures may be formed on the substrate 100. For example, the first insulating interlayer 210 may be formed of a PEOX-based oxide, a TEOS-based oxide or a silicate glass-based oxide by a CVD process.

Portions of the first insulating interlayer 210 and the tunnel insulation pattern 115 between the cell region and the selection region (e.g., a right region in FIG. 16) may be etched to form a first opening 215. A first impurity may be implanted through the first opening 215 to form a first impurity region 103 at an upper portion of the substrate 100.

In some embodiments, the first opening 215 may be self-aligned with the gate mask 175 and the gate spacer 205.

Figure 17:
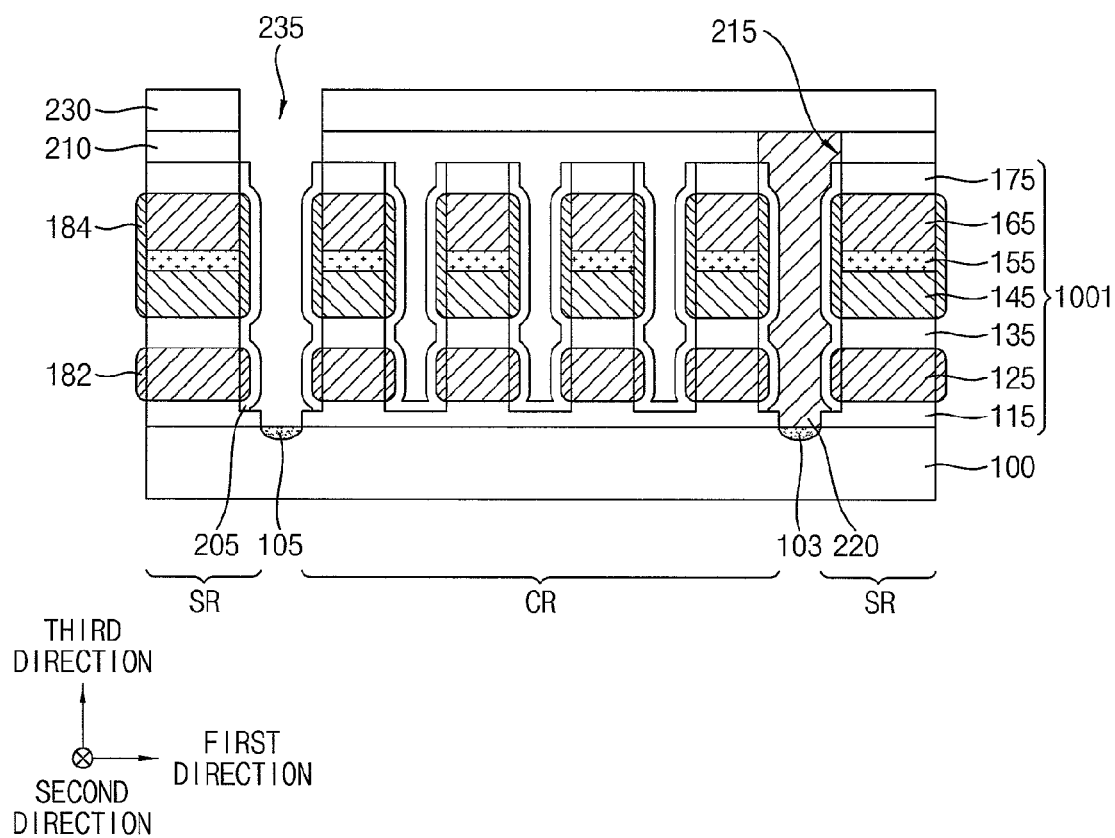

Referring to FIG. 17, a first plug 220 electrically connected to the first impurity region 103 may be formed in the first opening 215. A second insulating interlayer 230 may be formed on the first insulating interlayer 210 and the first plug 220.

Portions of the second insulating interlayer 230, the first insulating interlayer 210 and the tunnel insulation pattern 115 between the cell region CR and the selection region SR (e.g., the left SR region shown in FIG. 17) may be etched to form a second opening 235. A second impurity may be implanted through the second opening 235 to form a second impurity region 105.

In some embodiments, the second opening 235 may be self-aligned with the gate mask 175 and/or the gate spacer 205.

As also illustrated in FIG. 18, a second plug 240 electrically connected to the second impurity region 105 may be formed in the second opening 235. A bit line 250 electrically connected to the second plug 240 may be further formed on the second insulating interlayer 230. Accordingly, the semiconductor device 4000 of FIG. 12 may be manufactured.

According to example embodiments as described above, the capping layers 184 and 182 may be covered by the gate spacer 205. Thus, the capping layers 182 and 184 may be prevented from being damaged or oxidized by subsequent etching and deposition processes.

FIG. 18 is a cross-sectional view illustrating a semiconductor device 5000 in accordance with some example embodiments. The semiconductor device 5000 of FIG. 18 may have elements and/or constructions substantially the same as or similar to those of the semiconductor device 4000 illustrated in FIG. 12 except for an addition of an air gap. Thus, detailed descriptions on repeated elements and structures are omitted herein, and like reference numeral are used to designate like elements.

Referring to FIG. 18, an air gap 212 may be formed in a portion of the first insulating interlayer 210 that has been formed between the gate structures on the cell region CR.

In example embodiments, a distance between the neighboring gate structures 1001 may be decreased by the second capping layer 184 and the gate spacer 205 as compared to a distance between the neighboring gate masks 175. Thus, the first insulating interlayer 210 may overhang between the neighboring metal-containing gates 165 that are neighboring each other to generate an air gap 212. In some embodiments, the air gap 212 may include a space between the second capping layers 184 that are neighboring each other, and may extend to a space between the first capping layers 182 that are neighboring each other.

According to example embodiments as described above, a parasitic capacitance and/or an interference between neighboring memory cells may be reduced by the air gap 212.

Figure 19:
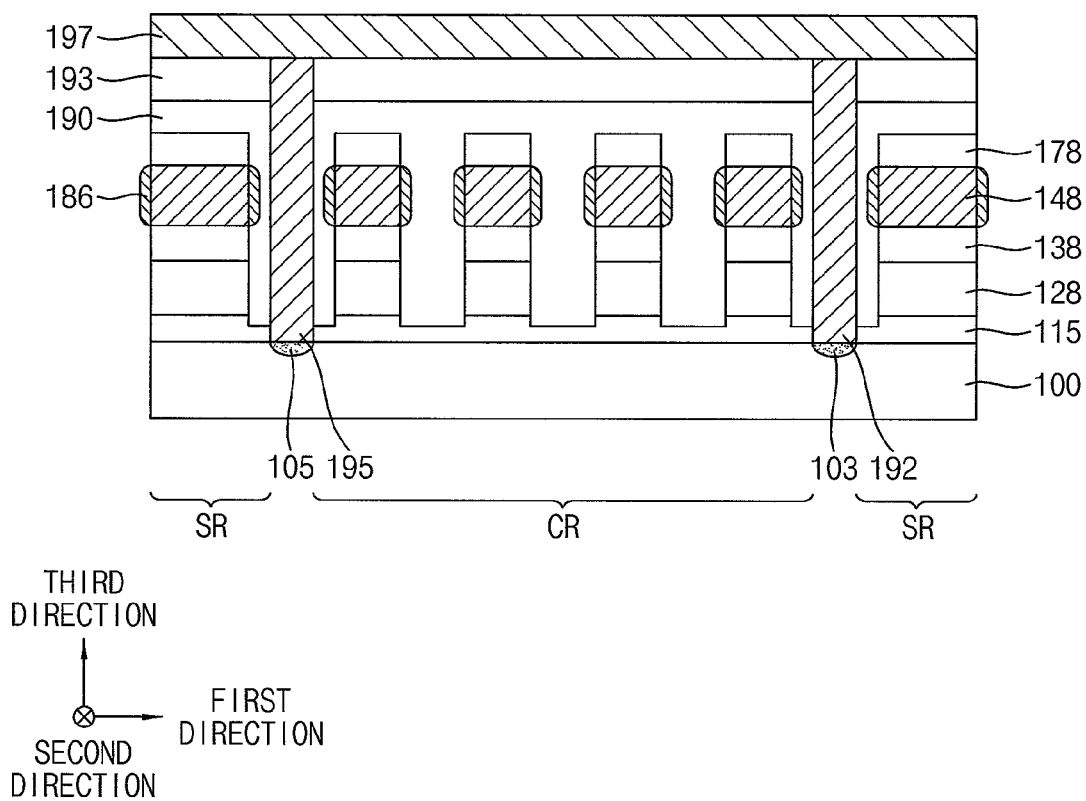

FIG. 19 is a cross-sectional view illustrating a semiconductor device 6000 in accordance with some example embodiments. For example, FIG. 19 illustrates a planar charge trap-type flash memory device.

The semiconductor device 6000 of FIG. 19 may have elements and/or constructions substantially the same as or similar to those of the semiconductor device 1000 illustrated in FIG. 1 except for structures or shapes of a gate structure and a capping layer. Thus, detailed descriptions on repeated elements and structures are omitted herein, and like reference numeral are used to designate like elements.

Referring to FIG. 19, a gate structure 1001 may include a tunnel insulation pattern 115, a charge trap pattern 128, a blocking pattern 138, a gate electrode 148 and a gate mask 178, which may be sequentially stacked on a substrate 100 in the third direction.

The tunnel insulation pattern 115 may include a structure and a material substantially the same as or similar to that of the tunnel insulation pattern illustrated in FIG. 1.

The charge trap pattern 128 may include a nitride, such as silicon nitride. The blocking pattern 138 may include silicon oxide, or a high-k metal oxide, such as hafnium oxide, zirconium oxide, aluminum oxide, tantalum oxide or titanium oxide. The gate electrode 148 may include a conductive material, such as doped polysilicon, a metal, a metal nitride or a metal silicide. The gate mask 178 may include silicon nitride or silicon oxynitride.

In example embodiments, a capping layer 186 may be formed on a sidewall of the gate electrode 148.

For example, a tunnel insulation layer, a charge trap layer, a blocking layer, a gate electrode layer and a gate mask layer may be sequentially formed on the substrate 100 in the third direction, and then may be partially etched as illustrated in FIG. 3 to form a plurality of the gate structures 1001.

As described with reference to FIG. 4, a silicon-based material may be introduced to form the capping layer 186 selectively on the sidewall of the gate electrode 148. As described with reference to FIGS. 8 and 11, the silicon-based material may have a greater affinity with respect to a metal or polysilicon. Thus, a deposition time may be controlled such that the capping layer 186 may be formed only on substantially the sidewall of the gate electrode 148.

Therefore, metal migration from the gate electrode 148 may be blocked, and an additional cell area may be achieved.

Figure 21:
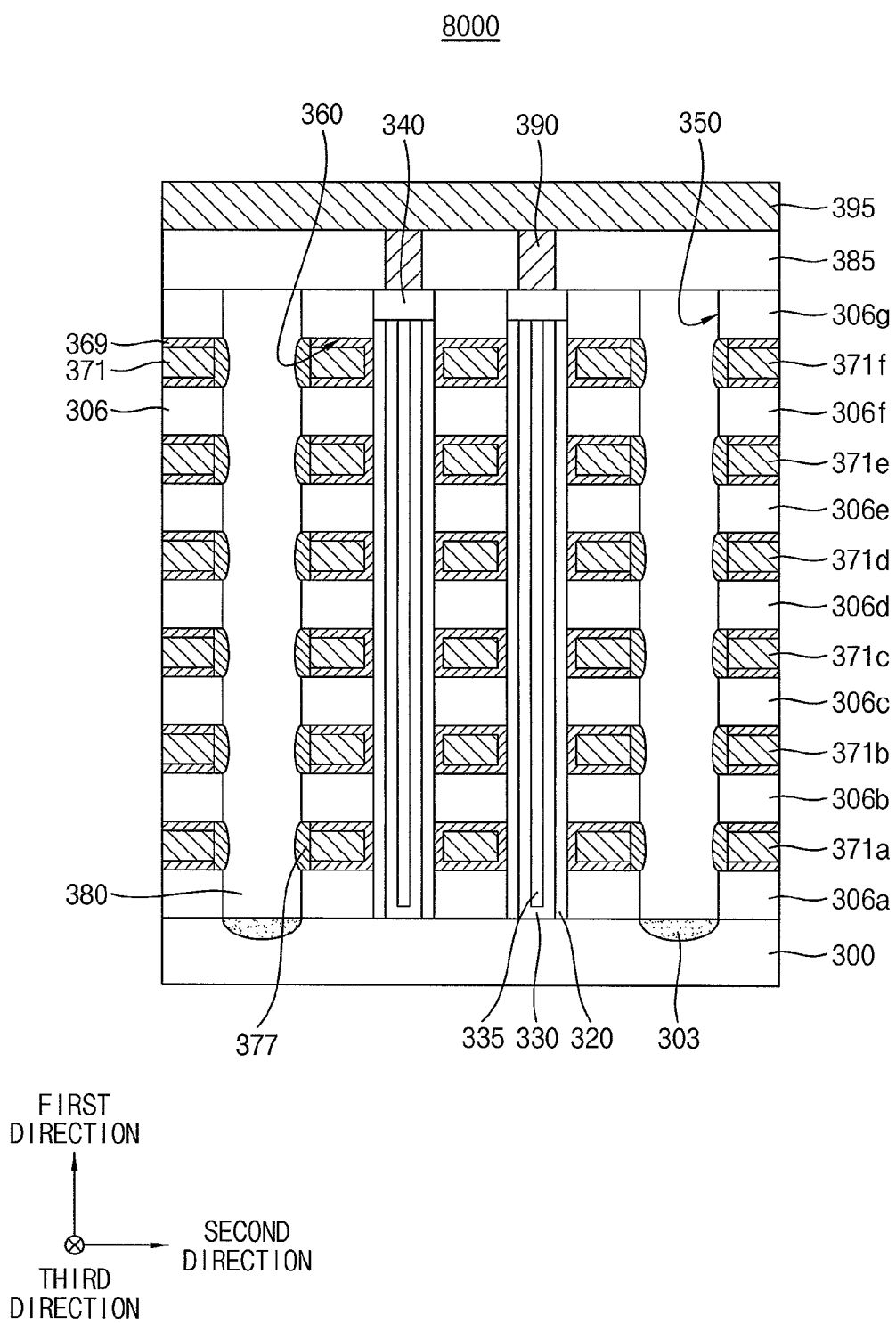

FIG. 20 is a cross-sectional view illustrating a semiconductor device 7000 in accordance with example embodiments. FIG. 21 is a cross-sectional view illustrating a semiconductor device 8000 in accordance with some example embodiments. For example, FIGS. 20 and 21 each illustrate a vertical memory device including channels that may vertically protrude from a top surface of a substrate.

In FIGS. 20 and 21, a direction substantially vertical to the top surface of the substrate is referred to as a first direction, and two directions substantially parallel to the top surface of the substrate and crossing each other are referred to as a second direction and a third direction. For example, the second direction and the third direction are substantially perpendicular to each other. The first direction is substantially perpendicular to the second and third directions. Additionally, a direction indicated by an arrow and a reverse direction thereof are considered as the same direction. The above mentioned definitions of the directions are the same throughout FIGS. 22 to 38.

Referring to FIG. 20, the semiconductor device 7000 may include a plurality of channels 330 extending in the first direction from a top surface of a substrate 300, and gate lines 370 and insulating interlayer patterns 306 surrounding the channels and extending substantially in, e.g., the third direction.

The substrate 300 may include a semiconductor material, e.g., silicon and/or germanium. In some embodiments, the substrate 300 may include single crystalline silicon. For example, the substrate 300 may serve as a p-type well of the semiconductor device.

The channel 330 may be in contact with the top surface 300a of the substrate 300, and may have substantially a hollow cylindrical shape or a cup shape. The channel 330 may include polysilicon or single crystalline silicon, and may include p-type impurities, such as boron (B), in a portion thereof.

A first filling pattern 335 may fill an inner space of the channel 330, and may have substantially a solid cylindrical shape or a pillar shape. The first filling pattern 335 may include an insulation material, such as silicon oxide. In an embodiment, the channel 330 may have a pillar shape or a solid cylindrical shape, and the first filling pattern 335 may be omitted.

A dielectric layer structure 320 may be formed on an outer sidewall of the channel 330. The dielectric layer structure 320 may have a substantially straw shape surrounding the outer sidewall of the channel 330.

The dielectric layer structure 320 may include a tunnel insulation layer (not shown), a charge trap layer (not shown) and a blocking layer (not shown) that may be sequentially stacked outwardly from the outer sidewall of the channel 330. The blocking layer may include silicon oxide or a metal oxide such as hafnium oxide or aluminum oxide. The charge trap layer may include a nitride, such as silicon nitride or a metal oxide, and the tunnel insulation layer pattern may include an oxide, such as silicon oxide. For example, the dielectric layer structure 320 may have an ONO-layered structure.

In an embodiment, a semiconductor pattern (not illustrated) may be further disposed between the top surface 300a of the substrate 300 and a bottom of the channel 330. In this case, the channel 330 may be disposed on a top surface of the semiconductor pattern, and the dielectric layer structure 320 may be disposed on a peripheral portion of the top surface of the semiconductor pattern. The semiconductor pattern may include, e.g., a single crystalline silicon or polysilicon.

A pad 340 may be formed on the dielectric layer structure 320, the channel 330 and the first filling pattern 335. For example, upper portions of the dielectric layer structure 320, the channel 330 and the first filling pattern 335 may be capped by the pad 340. The pad 340 may include polysilicon or single crystalline silicon, and may be optionally doped with n-type impurities, such as phosphorus (P) or arsenic (As).

A plurality of the pads 340 may be arranged along the third direction such that a pad row may be defined, and a plurality of the pad rows may be arranged in the second direction. A vertical channel structure including the dielectric layer structure 320, the channel 330 and the first filling layer pattern 335 may be also arranged corresponding to an arrangement of the pads 340. For example, a plurality of the vertical channel structures may be arranged along the third direction to form a channel row, and a plurality of the channel rows may be arranged in the second direction.

The gate lines 370 (e.g., 370a through 370f) may be formed on an outer sidewall of the dielectric structure 320, and may be spaced apart from each other in the first direction. In example embodiments, each gate line 370 may partially surround the channels 330 included in the plurality of the channel rows and may extend substantially in the third direction.

In some embodiments, the each gate line 370 may surround four channel rows. In this case, a gate line structure may be defined by the four channel rows and the gate lines 370 surrounding the four channel rows. A plurality of the gate line structures may be arranged substantially along the second direction.

For example, a lowermost gate line 370a may serve as a ground selection line (GSL), and an uppermost gate line 370f may serve as a string selection lines (SSL). Gate lines 370b through 370e between the GSL and the SSL may serve as word lines.

In this case, the GSL, the word lines, and the SSL may be respectively formed at a single level, four levels and a single level. However, the number of levels at which the GSL, the word line and the SSL are formed are not specifically limited. In some embodiments, the word lines may be formed at two levels, eight levels or at least 16 levels (e.g., "2×n" levels, n is an integer equal to or greater than 8). The stacked number of the gate lines 370 may be determined based on a circuit design and/or a degree of integration of the vertical memory device.

In the case that the semiconductor pattern is formed between the channel 330 and the substrate 300, the GSL 370a may surround an outer sidewall of the semiconductor pattern. A gate insulation layer (not illustrated) may be further formed between the GSL 370a and the outer sidewall of the semiconductor pattern.

The gate lines 370 and the insulating interlayer patterns 306 (e.g., 306a through 306g) may be repeatedly and alternately stacked in the first direction. A gap 360 may be defined in the first direction by a space between the insulating interlayer patterns 306 and the neighboring gate lines 370.

In some embodiments, a barrier pattern 367 may be further formed on an inner wall of each gap 360. For example, the barrier pattern 367 may be formed on top and bottom surfaces of the insulating interlayer patterns 306 defining the gap 360, and on the outer sidewall of the dielectric layer structure 320. The gate line 370 may be in contact with an inner wall of the barrier pattern 367. That is, a barrier pattern 370 may be formed between a gate line 370 and neighboring insulating interlayer patterns 306.

The gate line 370 may include a metal, such as W, Cu, Al, Ti, Ta, etc. The barrier pattern 367 may include a metal nitride, such as titanium nitride or tantalum nitride.

The insulating interlayer pattern 306 may include an oxide-based material, e.g., silicon oxide ($SiO_2$), silicon oxycarbide (SiOC) or silicon oxyfluoride (SiOF). The gate lines 370 included in one gate line structure may be insulated from each other by the insulating interlayer patterns 306.

In some embodiments, the insulating interlayer patterns 306 and the gate lines 370 may be stacked along the first direction in a pyramidal shape or a stepped shape. In this case, the gate line 370 and the insulating interlayer pattern 306 of each level may include a step portion extending in the third direction.

A second filling pattern 380 may be interposed in the second direction between the neighboring gate line structures. For example, the second filling pattern 380 may be formed in an opening 350 that may be formed through the gate line structure in the first direction and may extend substantially in the third direction. Thus, the gate line structure may be defined by neighboring second filling patterns 380, and the second filling pattern 380 may serve as a gate line cut pattern. The second filling pattern 380 may include an insulation material, such as silicon oxide.

In example embodiments, a capping layer 375 may be formed on sidewalls of the gate line 370 and the barrier pattern 367 that are exposed through the opening 350. The capping layer 375 may not substantially be formed on a sidewall of the insulating interlayer pattern 306, and may be formed selectively on the gate line 370 and the barrier pattern 367 of each level. The capping layer 375 may protrude in the opening 350, and thus may be inserted or embedded in the second filling pattern 380.

A second impurity region 303 may be formed at an upper portion of the substrate 300 under the second filling pattern 380. The second impurity region 303 may extend substantially in the third direction, and may serve as a CSL of the semiconductor device. The second impurity region 303 may include n-type impurities, such as P or As. A metal silicide pattern (not illustrated), such as a cobalt silicide pattern or a nickel silicide pattern, may be further formed on the second impurity region 303.

An upper insulation layer 385 may be formed on an uppermost insulating interlayer pattern 306g, the pad 340 and the second filling pattern 380. The upper insulation layer 385 may include an insulation material, such as silicon oxide.

A bit line 395 extending in, e.g., the second direction may be disposed on the upper insulation layer 385. The bit line 395 may be electrically connected to a plurality of the pads 340 via bit line contacts 390 formed through the upper insulation layer 385. A plurality of the bit lines 395 may be arranged along the second direction. In some embodiments, the bit lines 395 and the bit line contacts 390 may be stacked in the first direction by at least two levels.

Referring to FIG. 21, a capping layer 377 may be expanded in a gap 360 between a gate line 371 and an insulating interlayer pattern 306. In this case, a gate line 371 and a barrier pattern 369 may partially fill the gap 360, and the capping layer 377 may fill a remaining portion of the gap 360. In some embodiments, the capping layer 377 may protrude in the opening 350, and may be inserted or embedded in the second filling pattern 380.

FIGS. 22 to 34 are cross-sectional views and top plan views illustrating a method of manufacturing a semiconductor device in accordance with example embodiments. Specifically, FIGS. 23A and 29B are top plan views illustrating the semiconductor formed by the method. FIGS. 22, 23B, 24 to 28, 29B, and 30 to 34 are cross-sectional views taken along a line I-I' indicated in FIGS. 23A and 29B.

For example, FIGS. 22 to 34 illustrate a method of manufacturing the vertical memory device 7000 of FIG. 20.

Figure 22:
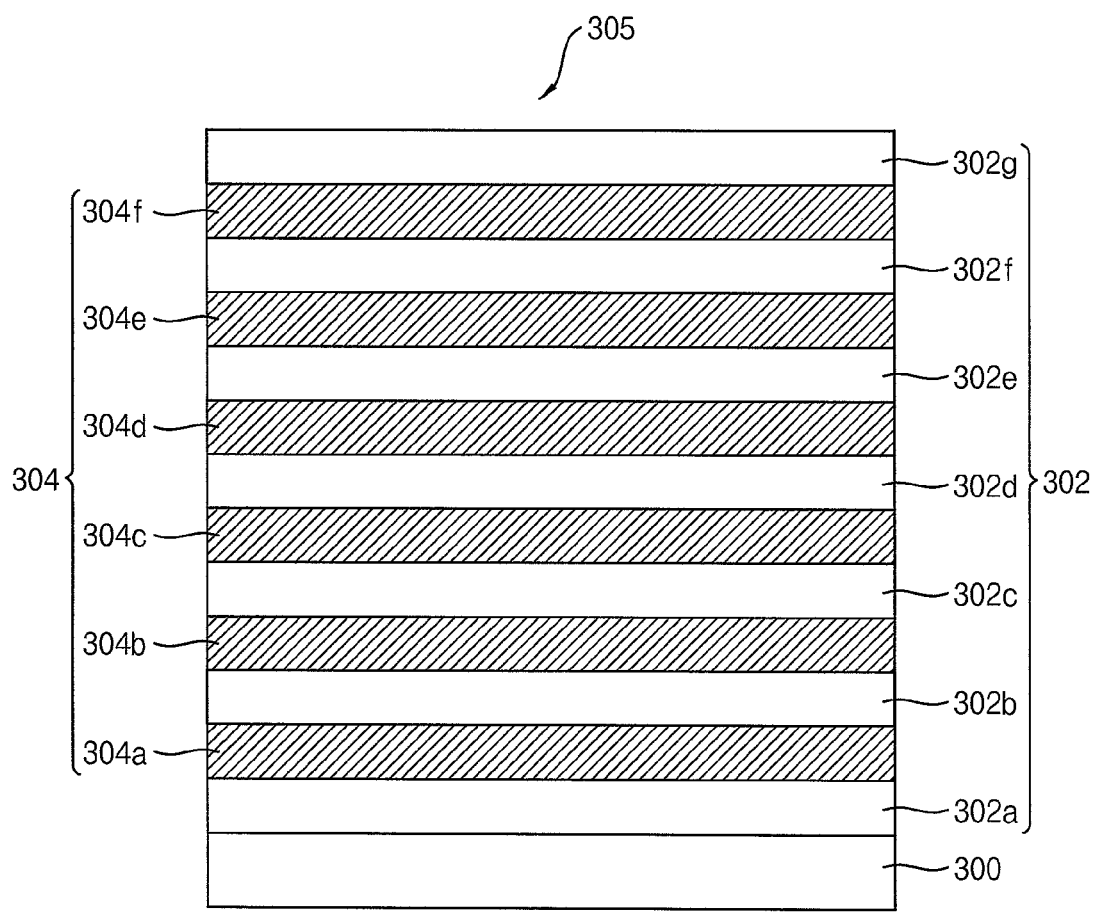
Figure 23B:
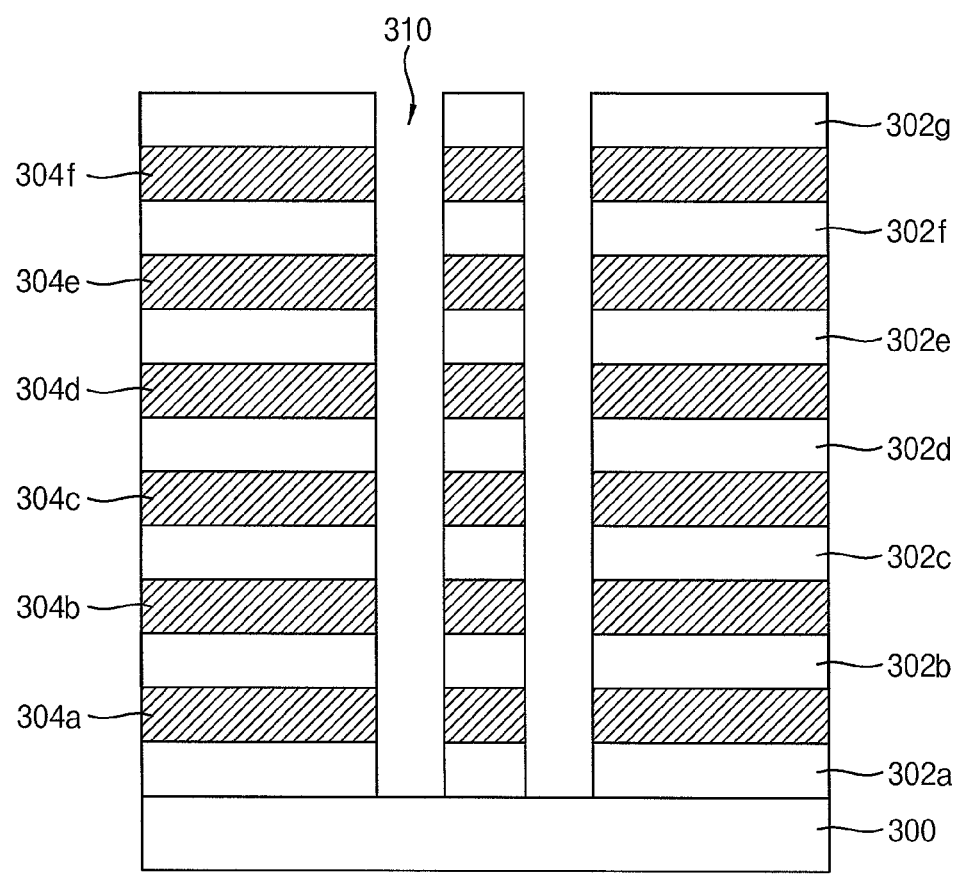

Referring to FIG. 22, insulating interlayers 302 (e.g., 302a through 302g) and sacrificial layers 304 (e.g., 304a through 304f) may be alternately and repeatedly formed in the first direction on a substrate 300 to form a mold structure 305.

In example embodiments, the insulating interlayer 302 may be formed of an oxide-based material, e.g., silicon oxide, silicon oxycarbide and/or silicon oxyfluoride. The sacrificial layer 304 may be formed of a material that may have an etching selectivity with respect to the insulating interlayer 302 and may be easily removed by a wet etching process. For example, the sacrificial layer 304 may be formed of a nitride-based material, e.g., silicon nitride and/or silicon boronitride.

The insulating interlayer 302 and the sacrificial layer 304 may be formed by, e.g., a CVD process, a PECVD process, an ALD process, etc. A lowermost insulating interlayer 302a may be formed by a thermal oxidation process on a top surface 300a of the substrate 300.

The sacrificial layers 304 may be removed in a subsequent process to provide spaces for a GSL, a word line and an SSL. Thus, the number of the insulating interlayers 302 and the sacrificial layers 304 may be determined based on the number of the GSL, the word line and the SSL.

For example, each of the GSL and the SSL may be formed at a single level, and the word line may be formed at four levels. In this case, the sacrificial layers 304 and the insulating interlayers 302 are formed at six levels and seven levels, respectively.

In some embodiments, a lateral portion of the mold structure 305 may be etched in a stepwise manner to form steps or stairs extending in the third direction.

Referring to FIGS. 23A and 23B, channel holes 310 may be formed through the mold structure 305. A top surface 300a of the substrate 300 may be exposed through the channel holes 310

In example embodiments, a hard mask (not illustrated) may be formed on an uppermost insulating interlayer 302g. The insulating interlayers 302 and the sacrificial layers 304 may be partially etched by performing, e.g., a dry etching process. The hard mask may be used as an etching mask to form the channel holes 310. A sidewall of the channel hole 310 may be substantially vertical with respect to the top surface of the substrate 300. However, the sidewall of the channel hole 310 may be tapered due to characteristics of the dry etching process.

The hard mask may be formed of silicon-based or carbon-based spin-on hardmask (SOH) materials, and/or a photoresist material. The hard mask may be removed by an ashing process and/or a strip process after the formation of the channel holes 310.

As illustrated in FIG. 23A, a plurality of the channel holes 310 may be formed along the third direction to form a channel hole row. A plurality of the channel hole rows may be formed along the second direction.

The channel hole rows may be arranged such that the channel holes 310 may be formed in a zigzag arrangement, as shown in FIG. 23A. Thus, a density of the channel holes 310 in a unit area of the substrate 300 may be enhanced.

The predetermined number of the channel hole rows may define a channel hole group. For example, four channel hole rows illustrated in FIG. 23A may define one channel hole group. Further, a plurality of the channel hole groups may be formed along the second direction.

Figure 24:
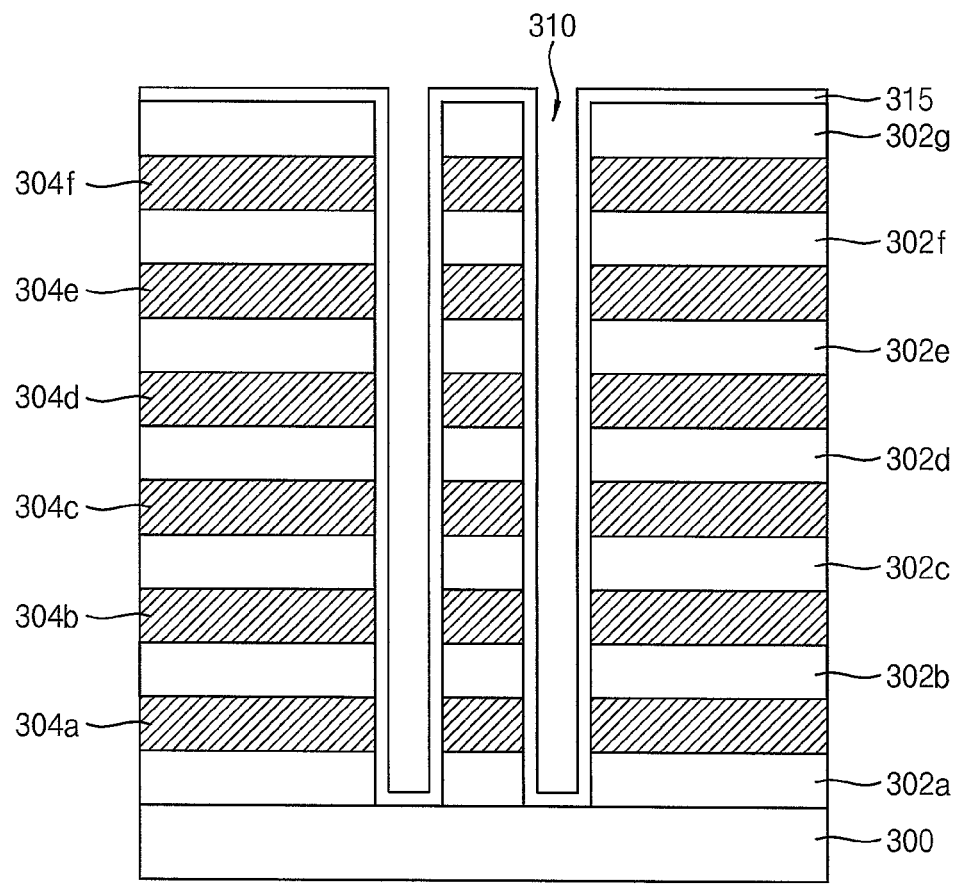

Referring to FIG. 24, a dielectric layer 315 may be formed along sidewalls and bottoms of the channel holes 310, and the uppermost insulating interlayer 302g.

In some embodiments, a blocking layer (not shown), a charge trap layer (not shown) and a tunnel insulation layer (not shown) may be sequentially formed to obtain the dielectric layer 315. For example, the blocking layer may be formed using an oxide, e.g., silicon oxide, the charge trap layer may be formed using silicon nitride or a metal oxide, and the tunnel insulation layer may be formed using an oxide, e.g., silicon oxide. The dielectric layer 315 may be formed as an ONO-layered structure. The blocking layer, the charge trap layer and the tunnel insulation layer may be formed by a CVD process, a PECVD process, an ALD process, etc.

Figure 25:
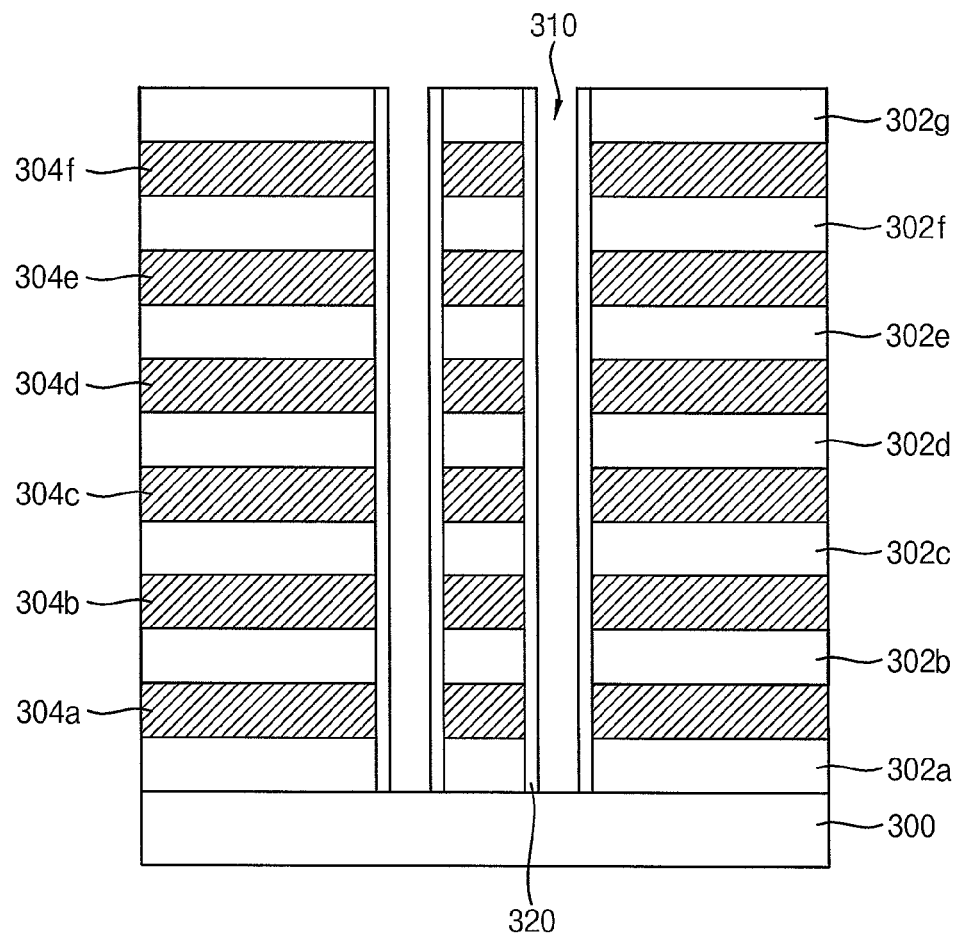

Referring to FIG. 25, the dielectric layer 315 may be partially removed to form a dielectric layer structure 320.

For example, upper and lower portions of the dielectric layer 315 may be removed by an etch-back process. In example embodiments, portions of the dielectric layer 315 formed on the top surfaces of the uppermost insulating interlayer 302g and the substrate 300 may be substantially removed to form the dielectric layer structure 320.

The dielectric layer structure 320 may be formed in each channel hole 310. For example, the dielectric layer structure 320 may be formed on the sidewall of the channel hole 310, and may have a substantially straw shape. The top surface of the substrate 300 may be exposed again after the formation of the dielectric layer structure 320.

Figure 26:
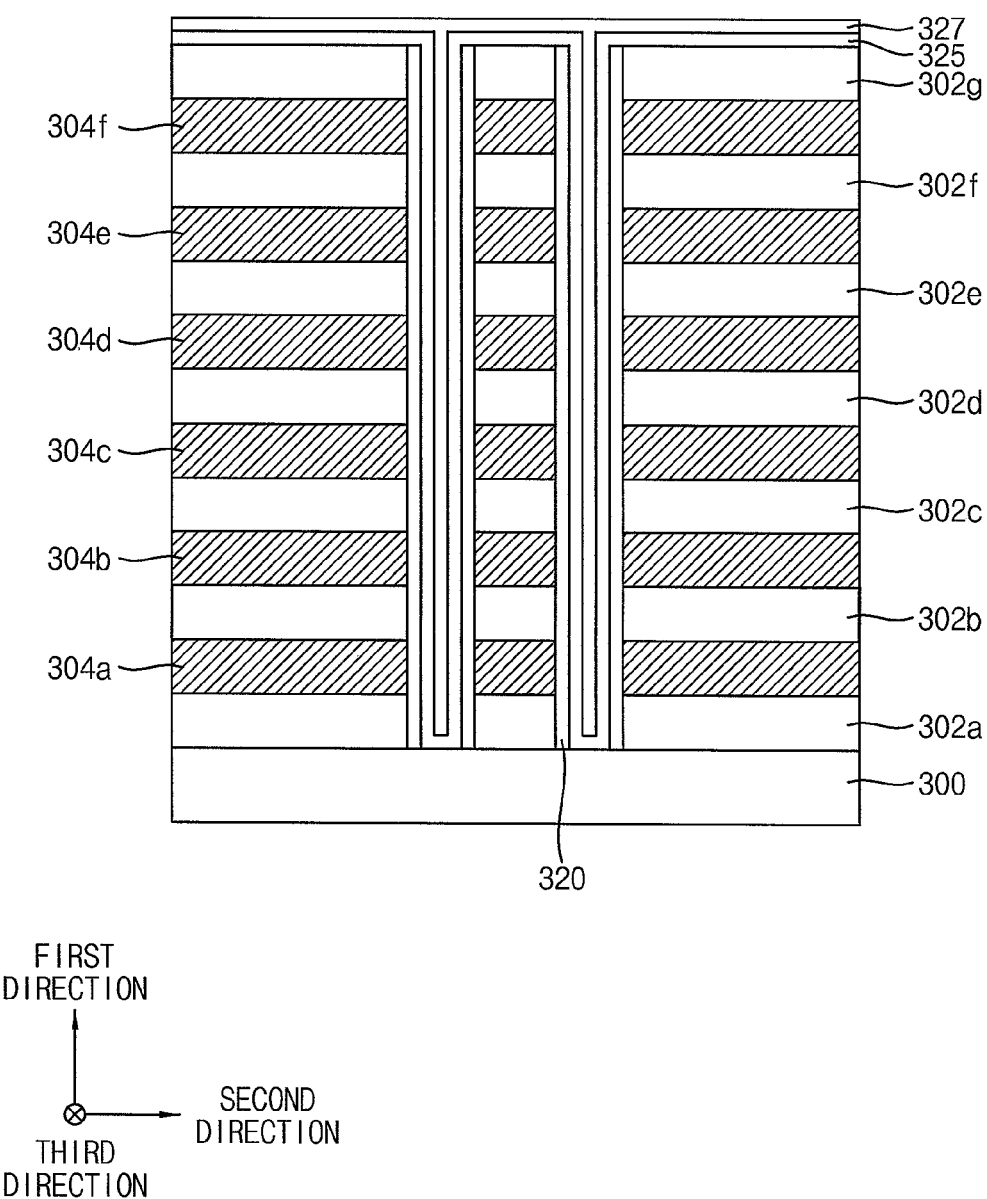

Referring to FIG. 26, a channel layer 325 may be formed on surfaces of the uppermost insulating interlayer 302g and the dielectric layer structures 320, and the top surface of the substrate 300 exposed through the channel holes 310, and then a first filling layer 327 may be formed on the channel layer 325 to sufficiently fill remaining portions of the channel holes 310.

In example embodiments, the channel layer 325 may be formed using polysilicon or amorphous silicon optionally doped with impurities. In an embodiment, a heat treatment or a laser beam irradiation may be further performed on the channel layer 325. In this case, the channel layer 325 may include single crystalline silicon and defects in the channel layer 325 may be cured.

The first filling layer 327 may be formed using an insulation material, e.g., silicon oxide or silicon nitride. The channel layer 325 and the first filling layer 327 may be formed by a CVD process, a PECVD process, an ALD process, etc.

In an embodiment, the channel layer 325 may sufficiently fill the channel holes 310. In this case, the formation of the first filling layer 327 may be omitted.

Figure 27:
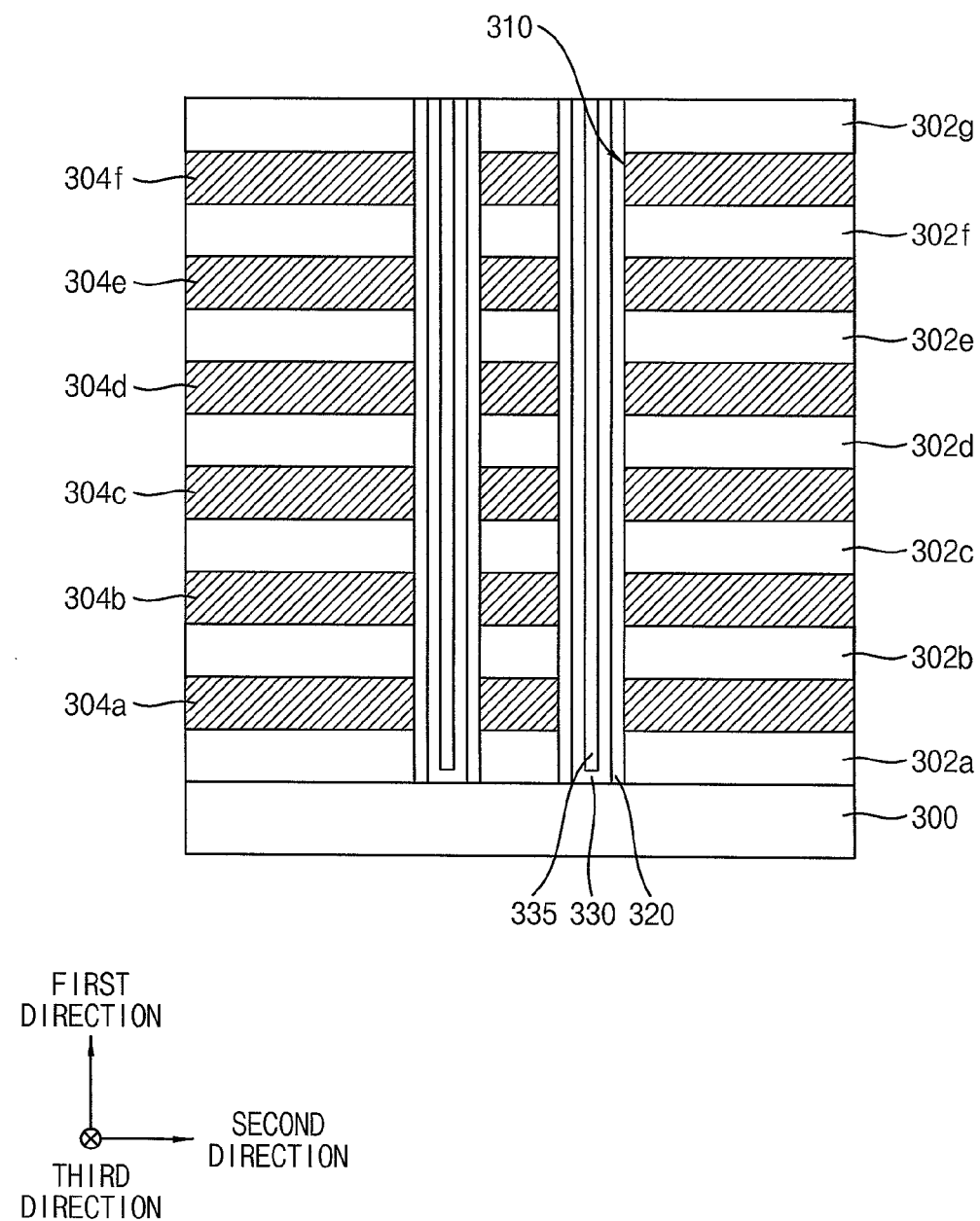

Referring to FIG. 27, upper portions of the first filling layer 327 and the channel layer 325 may be planarized by, e.g., a CMP process and/or an etch-back process until the uppermost insulating interlayer 302g is exposed. Accordingly, a channel 330 and a first filling pattern 335 sequentially stacked from a sidewall of the dielectric layer structure 320 may be formed to fill the channel hole 310.

The channel 330 may have a substantially cup shape, and may be in contact with the top surface of the substrate 300 exposed through the channel hole 310. The first filling pattern 335 may have a substantially pillar shape or a solid cylindrical shape. In an embodiment, if the channel layer 325 fully fills the channel holes 310, the first filling pattern 335 may be omitted and the channel 330 may have a pillar shape or a solid cylindrical shape.

The channel 330 may be formed in each channel hole 310, and thus a channel row comparable to the channel hole row may be formed. For example, four channel rows may define one channel group.

In some embodiments, a semiconductor pattern may be further formed at a lower portion of the channel hole 310 before forming the dielectric layer structure 320 and the channel 330. The semiconductor pattern may be formed by a selective epitaxial growth (SEG) process using the top surface of the substrate 100 exposed through the channel hole 310 as a seed. The semiconductor pattern may include polysilicon or single crystalline silicon.

Referring to FIG. 28, a pad 340 capping an upper portion of the channel hole 310 may be formed.

For example, upper portions of the dielectric layer structure 320, the channel 330 and the first filling pattern 335 may be partially removed by, e.g., an etch-back process, to form a recess 337. A bottom of the recess 337 may be located above a top surface of an uppermost sacrificial layer 304f.

A pad layer may be formed on the dielectric layer structure 320, the channel 330 and the first filling pattern 335 to sufficiently fill the recess 337. An upper portion of the pad layer may be planarized by, e.g., a CMP process, until the top surface of the uppermost insulating interlayer 302g may be exposed to form the pad 340. In example embodiments, the pad layer may be formed using polysilicon optionally doped with n-type impurities. In an embodiment, a preliminary pad layer including amorphous silicon may be formed, and then a crystallization process may be performed thereon to form the pad layer.

Figure 29A:
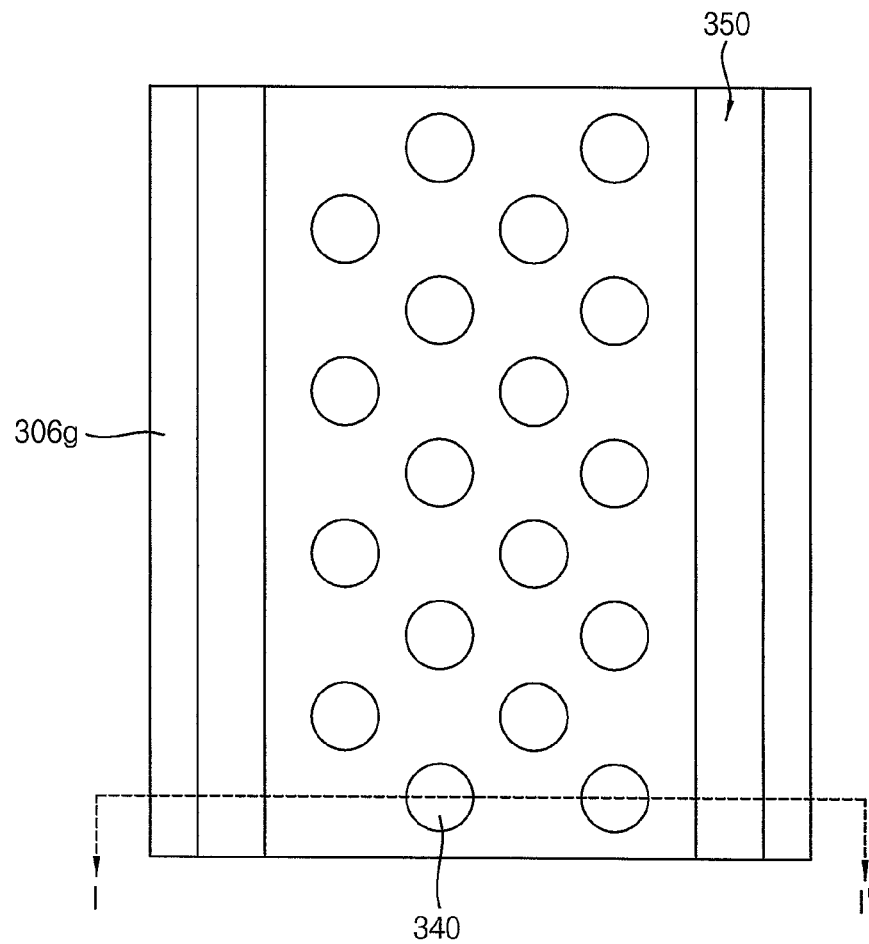
Figure 29B:
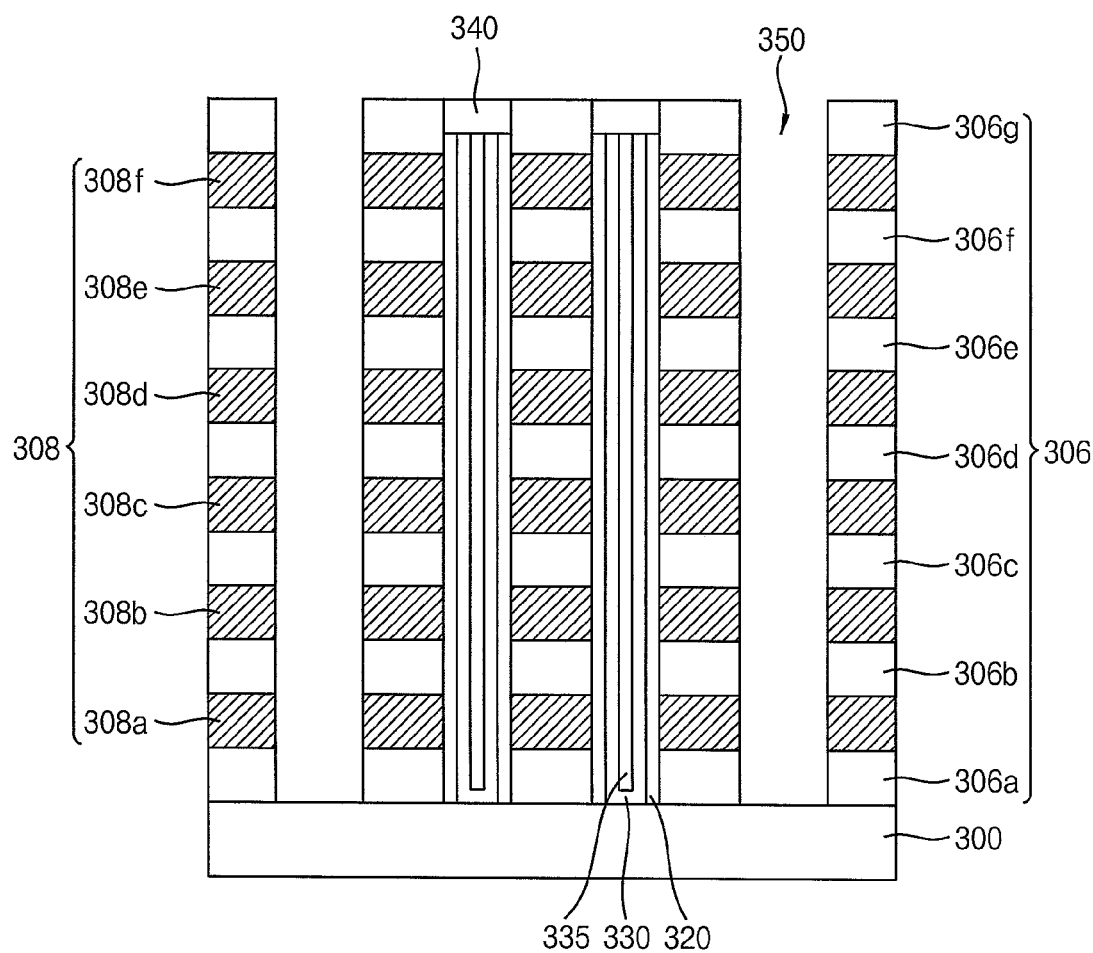

Referring to FIGS. 29A and 29B, the mold structure 305 may be partially etched to form an opening 350.

For example, a hard mask (not illustrated) covering the pads 340 and partially exposing the uppermost insulating interlayer 302g between some of the channel rows may be formed on the uppermost insulating interlayer 302g. The insulating interlayers 302 and the sacrificial layers 304 may be partially etched by, e.g., a dry etching process using the hard mask as an etching mask to form the opening 350. The hard mask may be formed using a photoresist material or an SOH material. The hard mask may be removed by an ashing process and/or a strip process after the formation of the opening 350.

The opening 350 may extend through the mold structure 305 in the first direction such that the top surface of the substrate 300 may be exposed. The opening 350 may extend substantially in the third direction, and a plurality of the openings 350 may be formed along the second direction.

The opening 350 may serve as a gate line cut region. The channel group may be defined by the openings 350 neighboring in the second direction. In an embodiment, four channel rows between the openings 350 may define the channel group.

After the formation of the openings 350, the insulating interlayers 302 and the sacrificial layers 304 may be changed into insulating interlayer patterns 306 (e.g., 306a through 306g) and sacrificial patterns 308 (e.g., 308a through 308f). The insulating interlayer pattern 306 and the sacrificial pattern 308 at each level may have a plate shape surrounding the channel group and extending in the third direction.

Referring to FIG. 30, the sacrificial patterns 308, the sidewalls of which are exposed by the opening 350, may be removed. In example embodiments, the sacrificial patterns 308 may be removed by a wet etching process using, e.g., phosphoric acid and/or sulfuric acid as an etchant solution.

A gap 360 may be defined by a space from which the sacrificial pattern 308 is removed. A plurality of the gaps 360 may be formed along the first direction between the adjacent insulating interlayer patterns 306. An outer sidewall of the dielectric layer structure 320 may be partially exposed by the gap 360.

Figure 31:
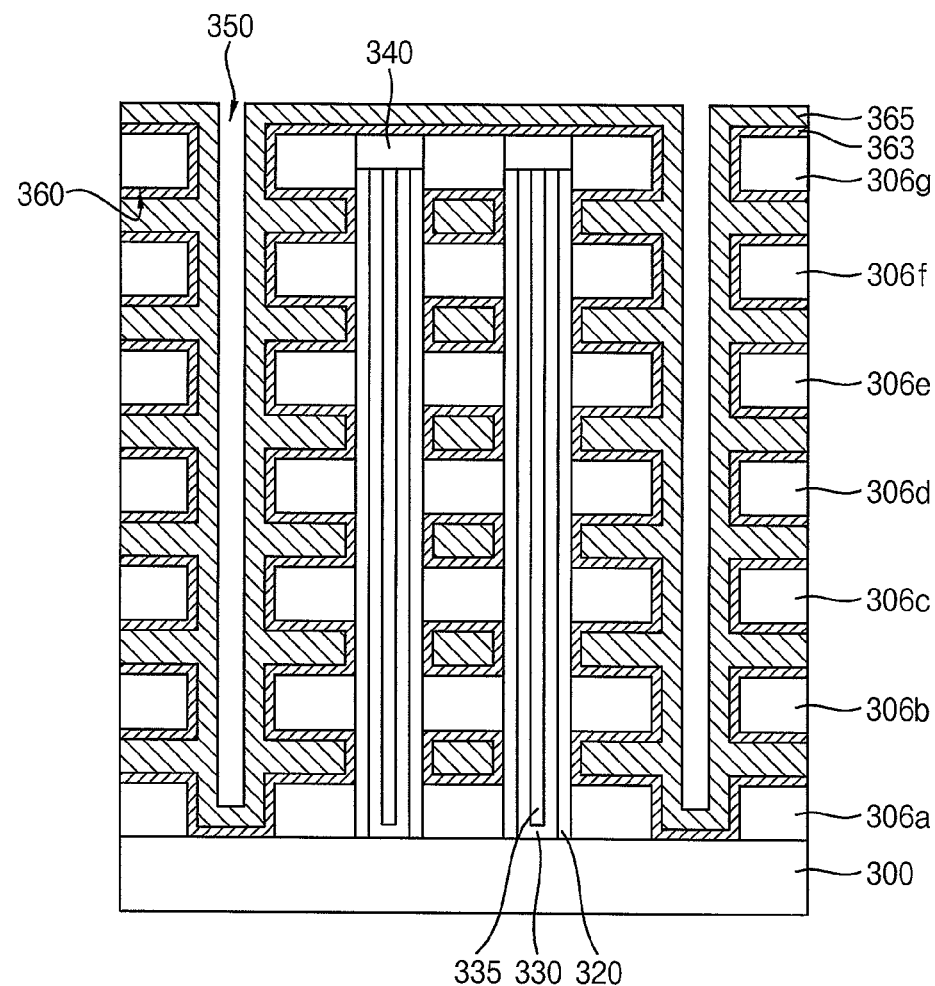

Referring to FIG. 31, a barrier layer 363 may be formed along the exposed outer sidewalls of the dielectric layer structures 320, inner walls of the gaps 360, surfaces of the insulating interlayer patterns 306, and the top surfaces of the pads 340 and the substrate 300. A gate electrode layer 365 may be formed on the barrier layer 363. In example embodiments, the gate electrode layer 365 may sufficiently fill the gaps 360, and may at least partially fill the opening 350.

In example embodiments, the barrier layer 363 may be formed of a metal nitride, such as titanium nitride, tantalum nitride or tungsten nitride. The gate electrode layer 365 may be formed of a metal, such as Ti, Ta, W, Al or Cu.

The barrier layer 363 and the gate electrode layer 365 may be formed by a sputtering process, an ALD process, a CVD process or a PVD process.

Figure 32:
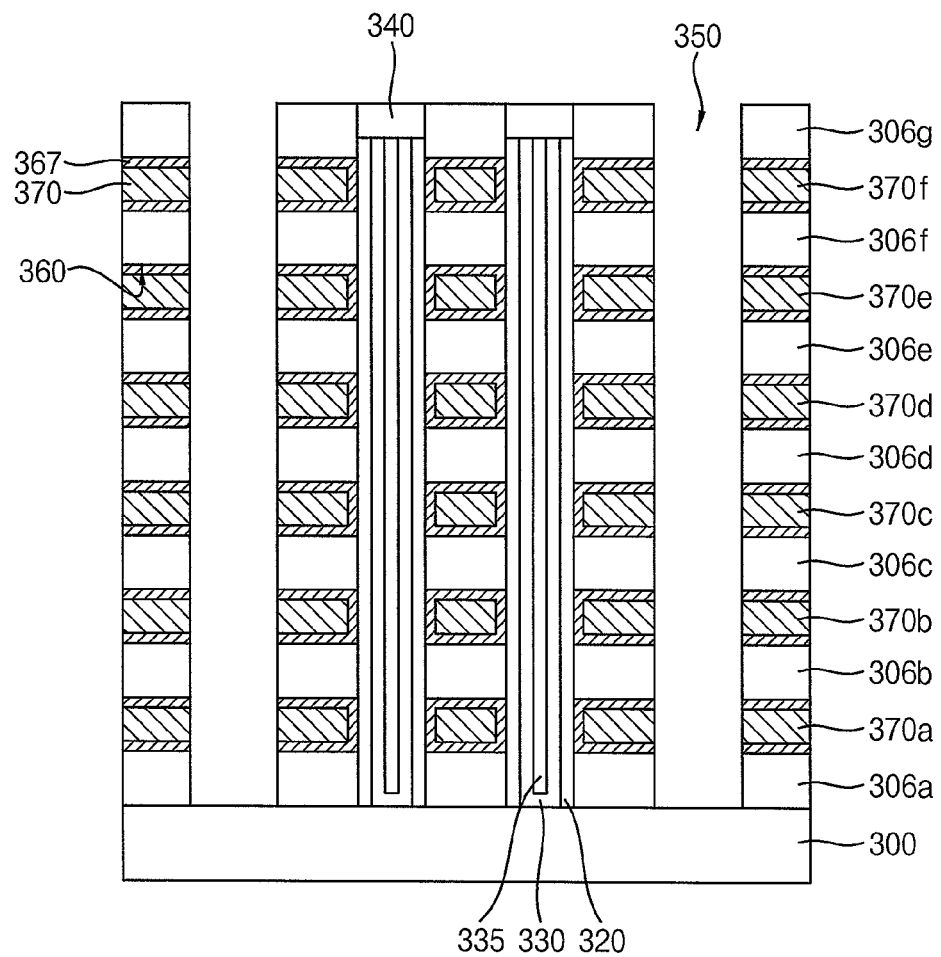

Referring to FIG. 32, the barrier layer 363 and the gate electrode layer 365 may be partially etched to form a barrier pattern 367 and a gate line 370 in the gap 360 of each level. The gate line 370 may surround the channels 330 included in the channel group and may have a plate shape extending in the third direction.

In example embodiments, upper portions of the barrier layer 363 and the gate electrode layer 365 may be planarized by a CMP process until an uppermost insulating interlayer pattern 306g may be exposed. The top surface of the pad 340 may be exposed again. Portions of the barrier layer 363 and the gate electrode layer 365 formed in the opening 350 may be etched to obtain the barrier patterns 367 and the gate lines 370 filling the gaps 360 by a wet etching process using, e.g., a hydrogen peroxide-containing solution. The barrier pattern 367 may be formed along the inner wall of the gap 360, and the gate line 370 may be formed on the barrier pattern 367 to fill the gap 360.

The gate lines 370 may include the GSL, the word line and the SSL sequentially stacked and spaced apart from one another in the first direction. For example, a lowermost gate line 370a may serve as the GSL. The gate lines 370b to 370e on the GSL may serve as the word lines. An uppermost gate line 370f on the word line may serve as the SSL.

The gate line 370 at each level may surround the channel group including the predetermined number of the channel rows, e.g., four channel rows. Accordingly, a gate line structure may be defined by the gate lines 370 that are stacked in the first direction, surround the predetermined number of the channel rows and extend in the third direction.

Referring to FIG. 33, a process substantially the same as or similar to that illustrated with reference to FIG. 4 may be performed.

Accordingly, a capping layer 375 may be formed on sidewalls of the gate line 370 and the barrier pattern 367 of each level exposed by the opening 350. As described with reference to FIG. 11, a silicon-based material, such as polysilicon, may be deposited in which the silicon-based material has a greater affinity and a shorter deposition-initiating time on a metal-containing material than on an insulation material, such as silicon oxide. Thus, a deposition time may be controlled within a predetermined range such that the capping layer 375 may be formed substantially only on the sidewalls of the gate line 370 and the barrier pattern 367.

In example embodiments, as illustrated in FIG. 33, sidewalls of the gate lines 340, the barrier patterns 367 and the insulating interlayer patterns 306 may extend on substantially the same vertical plane. The capping layer 375 may protrude from the sidewalls of the gate line 370 and the barrier pattern 367 into the opening 350.

Figure 34:
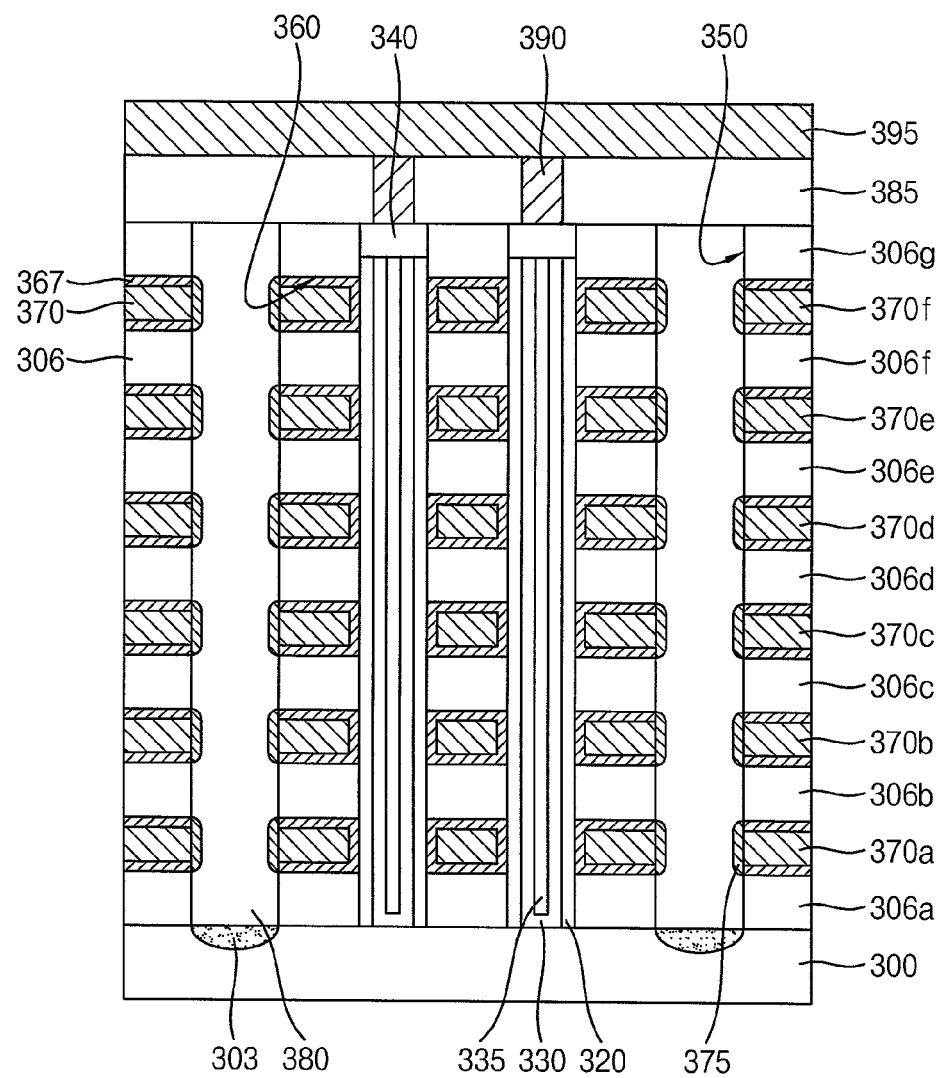

Referring to FIG. 34, an impurity region 303 may be formed at an upper portion of the substrate 300 exposed through the opening 350, and a second filling pattern 380 may be formed in the opening 350.

For example, n-type impurities, such as P or As, may be implanted through the opening 350 to form the impurity region 303. The impurity region 303 may serve as a CSL extending in the third direction. In an embodiment, a metal silicide pattern (not illustrated) including, e.g., nickel silicide or cobalt silicide, may be further formed on the impurity region 303 to reduce a resistance of the CSL.

A second filling layer sufficiently filling the opening 350 may be formed on the impurity region 303, the uppermost insulating interlayer pattern 306g and the pad 130. An upper portion of the second filling layer may be planarized by a CMP process and/or an etch-back process until the uppermost insulating interlayer pattern 306g is exposed to form the second filling pattern 380. The second filling layer may be formed of, e.g., silicon oxide. In some embodiments, a CSL contact extending through the second filling pattern 380 and electrically connected to the impurity region 303 may be further formed.

In example embodiments, detachment and migration of metal components from the gate line 370 and/or the barrier pattern 367 caused while performing a high temperature deposition process and an etching process for the formation of the second filling pattern 380 or the CSL contact may be blocked by the capping layer 375. Therefore, operational failures between adjacent memory cells and/or strings included in the vertical memory device may be prevented.

Referring again to FIG. 34, an upper insulation layer 385 may be formed on the uppermost insulating interlayer pattern 306g, the second filling pattern 380 and the pad 340. The upper insulation layer 385 may be formed of an insulation material, such as silicon oxide by a CVD process or a spin coating process.

A bit line contact 390 may be formed through the upper insulation layer 385 to be electrically connected to the pad 340. A bit line 395 electrically connected to the bit line contact 390 may be formed on the upper insulation layer 385. The bit line contact 390 and the bit line 395 may be formed of a metal, a metal nitride or a doped polysilicon by a PVD process, an ALD process or a sputtering process.

A plurality of the bit line contacts 390 may be formed so that a bit line contact array comparable to an arrangement of the pads 340 may be formed. The bit line 395 may extend in, e.g., the second direction, and may be electrically connected to a plurality of the pads 340 via the bit line contacts 390. A plurality of the bit lines 395 may be formed along the third direction.

FIGS. 35 to 38 are cross-sectional views illustrating a method of manufacturing a semiconductor device in accordance with some example embodiments. For example, FIGS. 35 to 38 illustrate a method of manufacturing the vertical memory device 8000 of FIG. 21. Detailed descriptions on processes and materials substantially the same as or similar to those illustrated with reference to FIGS. 22 to 34 are omitted herein.

Figure 35:
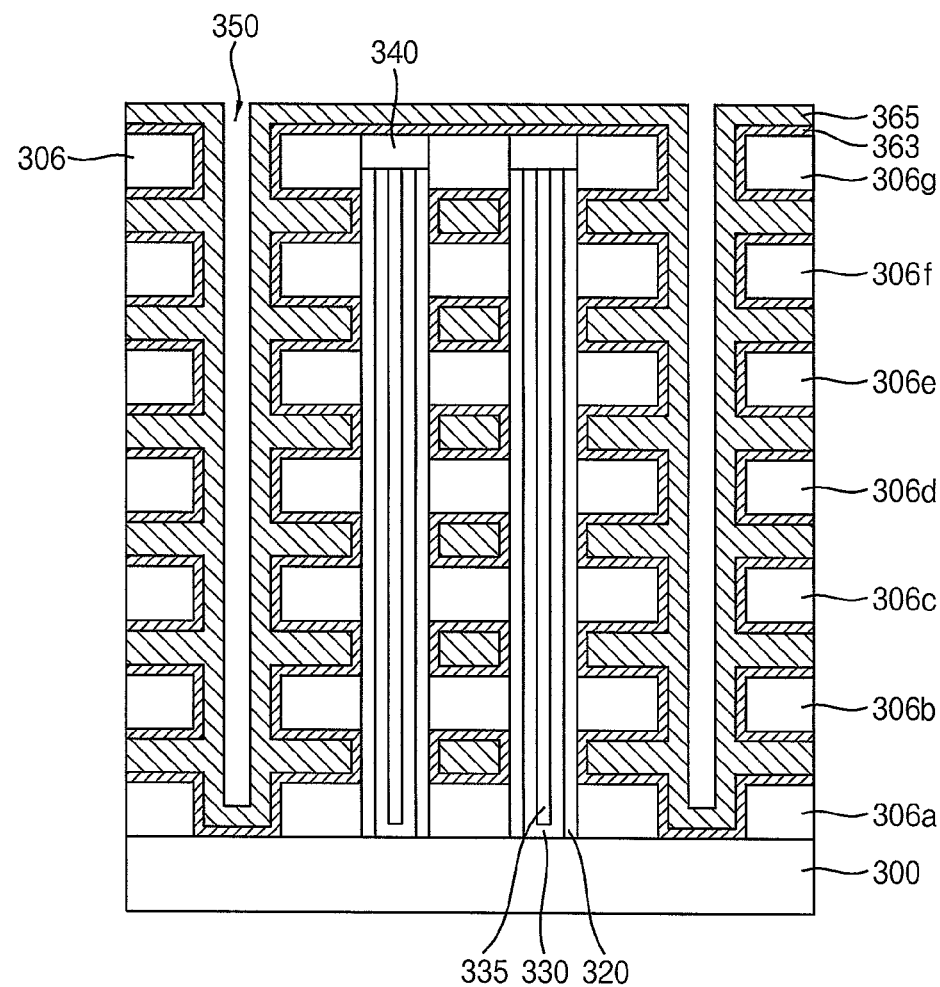

Referring to FIG. 35, processes substantially the same as or similar to those illustrated with reference to FIGS. 22 to 31 may be performed.

Accordingly, a mold structure may be formed on a substrate, and a plurality of channels 330 may be formed through the mold structure. A dielectric layer structure 320 may be formed on an outer sidewall of each channel 330, and a first filling pattern 335 may be formed in the each channel 330. An opening 350 extending in the third direction may be formed through the mold structure, and sacrificial patterns exposed by the opening 350 may be removed to form gaps. A barrier layer 363 may be formed along inner walls of the gaps and surfaces of insulating interlayer patterns 306, and a gate electrode layer 365 sufficiently filling the gaps may be formed on the barrier layer 363.

Referring to FIG. 36, the barrier layer 363 and the gate electrode layer 365 may be partially etched to form a barrier pattern 369 and a gate line 371 in the gap of each level.

In example embodiments, an amount of an etchant solution or an etching time may be controlled in the etching process so that portions of the barrier layer 363 and the gate electrode layer 365 formed in the gap may be partially removed. Accordingly, the barrier pattern 369 and the gate line 371 may partially fill the gap of each level, and a remaining portion of the gap, which is not filled with the barrier pattern 369 and the gate line 371, may be defined as a recess 372. An insulation between the gate lines 371 of different levels may be ensured by the formation of the recess 372.

Figure 37:
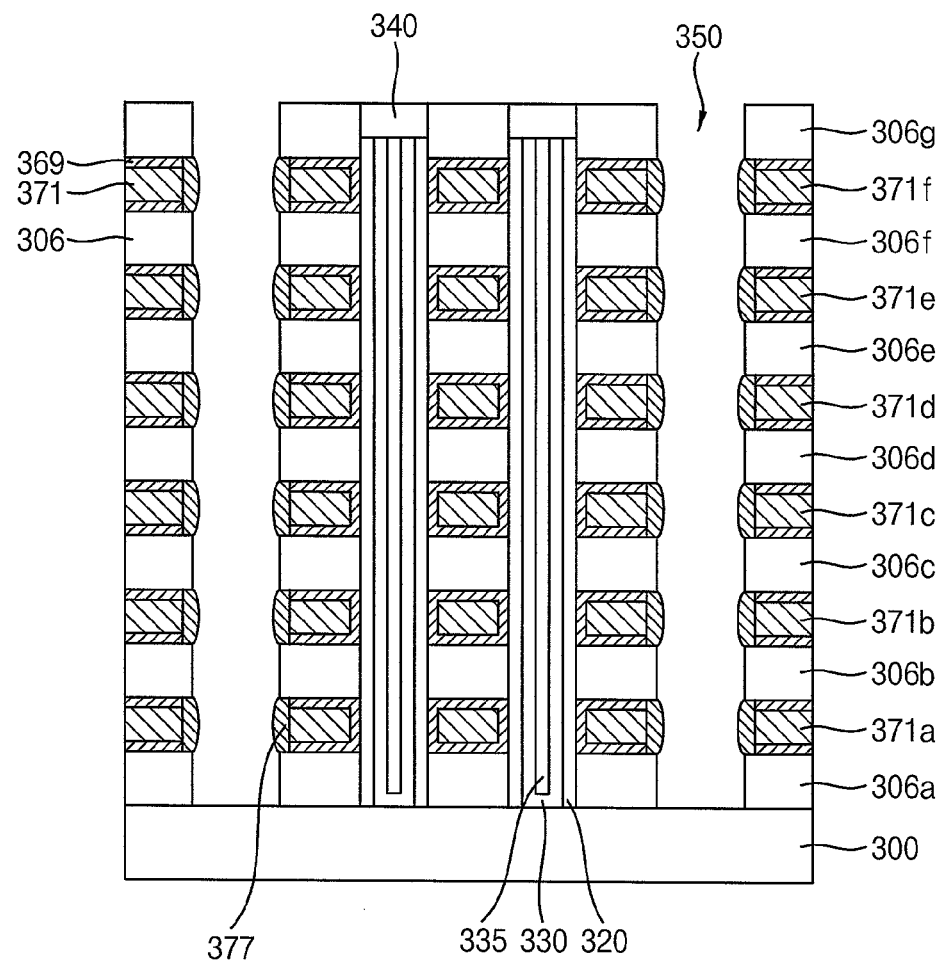

Referring to FIG. 37, a process substantially the same as or similar to that illustrated with reference to FIG. 33 may be performed to form a capping layer 377 on sidewalls of the barrier pattern 369 and the gate line 371.

The capping layer 377 may be substantially self-aligned with the barrier pattern 369 and the gate line 371 to fill the recess 372. The recess 372 may substantially serve as a guiding structure of a silicon-based material for forming the capping layer 377. The capping layer 377 may sufficiently fill the recess 372 and may protrude in the opening 350.

In example embodiments, a width of the gate line 371 may be reduced in the second direction by the formation of the recess 372. However, a reduced cell area may be compensated for by the capping layer 377. Further, the capping layer 377 may be self-aligned with the recess 372, and thus a separation of the capping layers 377 along the first direction may be ensured.

Referring to FIG. 38, a process substantially the same as or similar to that illustrated with reference to FIG. 34 may be performed.

For example, an impurity region 303 may be formed at an upper portion of the substrate 300 through the opening 350, and a second filling pattern 380 filling the opening 350 may be formed on the impurity region 303.

An upper insulation layer 385 may be formed on an uppermost insulating interlayer pattern 306g, the second filling pattern 380 and the pad 340. A bit line 395 electrically connected to the pads 370 via bit line contacts 390 may be formed on the upper insulation layer 385. Thus, the vertical memory device of FIG. 21 may be obtained.

In example embodiments, the vertical memory device may be embodied to include a three dimensional (3D) memory array. The 3D memory array may be monolithically formed on a substrate (e.g., semiconductor substrate, such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer. Each vertical NAND string may further include at least one select transistor located over memory cells. The at least one select transistor may have the same structure with the memory cells and may be formed monolithically together with the memory cells.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

According to example embodiments of the subject matter disclosed herein, a capping layer may be formed on a sidewall of a metal-containing gate in planar or vertical type flash memory devices using, e.g., a silicon-based material. The capping layer may serve as a barrier blocking migration or diffusion of metal components from the metal-containing gate. Further, widths of a floating gate and/or a control gate may be expanded by the capping layer, and thus an additional cell area may be achieved.

According to an example embodiment, a semiconductor device may comprise a substrate, a tunnel insulation pattern, a charge storage pattern, a dielectric pattern, a control gate pattern and a metal containing gate pattern. The tunnel insulation pattern may be formed on the substrate. The charge storage pattern may be formed on the tunnel insulation pattern in which the charge storage pattern may comprise a width in a first direction that is substantially perpendicular to a second direction and in which the second direction may be in a direction of the charge storage pattern from the substrate. The dielectric pattern may be formed on the charge storage pattern in which the dielectric pattern may comprise a width in the first direction and in which the width of the dielectric pattern may be less than the width of the charge storage pattern. The control gate may be formed on the dielectric pattern in which the control gate may comprise a width in the first direction and in which the width of the control gate may be greater than the width of the dielectric pattern. The metal-containing gate may be formed on the control gate.

In example embodiments, the metal-containing gate may comprise a sidewall, and in which the semiconductor device may further comprise a capping layer on the sidewall of the metal-containing gate. The capping layer may comprise polysilicon or amorphous silicon. The charge storage pattern and the control gate may comprise polysilicon.

In example embodiments, the capping layer may extend from the control gate in the first direction.

In example embodiments, the semiconductor device may further comprise a gate mask on the metal-containing gate in which the control gate may comprise a sidewall, and in which the capping layer may further extend in the second direction from the sidewall of the control gate to the sidewall of the metal-containing gate.

In example embodiments, the semiconductor device may further comprise a buffer pattern between the metal-containing gate and the control gate, the buffer pattern comprising a sidewall in which the capping layer may cover the sidewall of the metal-containing gate and the sidewall of the buffer pattern. The buffer pattern may comprise a metal nitride.

In example embodiments, the capping layer may comprise a width in the first direction, and the metal-containing gate may comprise a width in the first direction, in which a sum of the width of the capping layer and the width of the metal-containing gate may be greater than the width of the control gate.

In example embodiments, the capping layer may comprise a width in the first direction, and the metal-containing gate may comprises a width in the first direction, in which a sum of the width of the capping layer and the width of the metal-containing gate may be substantially the same as the width of the control gate.

In example embodiments, the gate structure may comprise a sidewall, and the semiconductor may further comprise a gate spacer covering the sidewall of the gate structure; and an insulating interlayer covering the gate spacer.

In example embodiments the semiconductor device may further comprise at least one gate structure arranged on the substrate in which the at least one gate structure may comprise the tunnel insulation pattern, the charge storage pattern, the dielectric pattern, the control gate and the metal-containing gate. The tunnel insulation pattern may include a protrusion on which the charge storage pattern for a gate pattern is disposed in which the protrusion may comprise a width in the first direction and in which the width of the protrusion may be less than the width of the charge storage pattern.

In example embodiments, the semiconductor device may further comprise at least two gate structures in which each gate structure may comprise a sidewall; a gate spacer covering the sidewall of the at least two gate structures; and an insulating interlayer covering the gate spacer. A portion of the insulating interlayer between the at least two gate structures may comprise an air gap therein.

In example embodiments, the semiconductor device may further comprise a capping layer on a sidewall of the metal-containing gate of at least one of the at least two gate structures in which the gate spacer covers a sidewall of the capping layer of the at least one of the at least two gate structures. The charge storage pattern may comprise a floating gate.

According to example embodiments, a method to form a semiconductor device is provided. In the method, a tunnel insulation pattern is formed on a substrate. A charge storage pattern is formed on the tunnel insulation pattern in which the charge storage pattern may comprise a width in a first direction that is substantially perpendicular to a second direction and in which the second direction may be in a direction of the charge storage pattern from the substrate. A dielectric pattern is formed on the charge storage pattern in which the dielectric pattern may comprise a width in the first direction in which the width of the dielectric pattern may be less than the width of the charge storage pattern. A control gate is formed on the dielectric pattern in which the control gate may comprises a width in the first direction and in which the width of the control gate may be greater than the width of the dielectric pattern. A metal-containing gate is formed on the control gate.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the subject matter disclosed herein. Accordingly, all such modifications are intended to be included within the scope of the subject matter as defined in the claims. In the claims, means-plus-function clauses are intended to cover the structures described herein as performing the recited function and not only structural equivalents, but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a tunnel insulation pattern on a substrate;
   a charge storage pattern on the tunnel insulation pattern, the charge storage pattern comprising a width in a first direction that is substantially perpendicular to a second direction, the second direction being in a direction of the charge storage pattern from the substrate;
   a dielectric pattern on the charge storage pattern, the dielectric pattern comprising a width in the first direction, the width of the dielectric pattern being less than the width of the charge storage pattern;
   a control gate on the dielectric pattern, the control gate comprising a width in the first direction, the width of the control gate being greater than the width of the dielectric pattern; and
   a metal-containing gate on the control gate, wherein the metal-containing gate comprises a sidewall, and the semiconductor device further comprises a capping layer on the sidewall of the metal-containing gate, and wherein the capping layer comprises polysilicon or amorphous silicon.

2. The semiconductor device of claim 1, wherein the capping layer comprises a width in the first direction, and the metal-containing gate comprises a width in the first direction, and
   wherein a sum of the width of the capping layer and the width of the metal-containing gate is substantially the same as the width of the control gate.

3. The semiconductor device of claim 1, wherein the capping layer comprises a width in the first direction, and the metal-containing gate comprises a width in the first direction, and
   wherein a sum of the width of the capping layer and the width of the metal-containing gate is greater than the width of the control gate.

4. The semiconductor device of claim 1, wherein the gate structure comprises a sidewall,
   the semiconductor further comprising:
   a gate spacer covering the sidewall of the gate structure; and
   an insulating interlayer covering the gate spacer.

5. The semiconductor device of claim 1, further comprising a buffer pattern between the metal-containing gate and the control gate, the buffer pattern comprising a sidewall,
   wherein the capping layer covers the sidewall of the metal-containing gate and the sidewall of the buffer pattern.

6. The semiconductor device of claim 5, wherein the buffer pattern comprises a metal nitride.

7. The semiconductor device of claim 1, wherein the semiconductor device further comprises at least one gate structure arranged on the substrate, and
   wherein the at least one gate structure comprises the tunnel insulation pattern, the charge storage pattern, the dielectric pattern, the control gate and the metal-containing gate.

8. The semiconductor device of claim 7, wherein the tunnel insulation pattern comprises a protrusion on which the charge storage pattern for a gate pattern is disposed.

9. The semiconductor device of claim 8, wherein the protrusion comprises a width in the first direction, and
   wherein the width of the protrusion is less than the width of the charge storage pattern.

10. The semiconductor device of claim 1, wherein the charge storage pattern and the control gate comprise polysilicon.

11. The semiconductor device of claim 10, wherein the capping layer extends from the control gate in the first direction.

12. The semiconductor device of claim 11, further comprising a gate mask on the metal-containing gate,
    wherein the control gate comprises a sidewall, and
    wherein the capping layer further extends in the second direction from the sidewall of the control gate to the sidewall of the metal-containing gate.

* * * * *